(12) United States Patent
Yungers et al.

(10) Patent No.: US 11,371,952 B2
(45) Date of Patent: *Jun. 28, 2022

(54) VERIFYING STRUCTURAL INTEGRITY OF MATERIALS

(71) Applicant: 3M INNOVATIVE PROPERTIES COMPANY, St. Paul, MN (US)

(72) Inventors: Christopher R. Yungers, St. Paul, MN (US); Subhalakshmi M. Falknor, Woodbury, MN (US); David H. Redinger, Afton, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 20 days.

This patent is subject to a terminal disclaimer.

(21) Appl. No.: 16/949,169

(22) Filed: Oct. 16, 2020

(65) Prior Publication Data

US 2021/0048403 A1    Feb. 18, 2021

Related U.S. Application Data

(63) Continuation of application No. 16/470,064, filed as application No. PCT/US2017/066590 on Dec. 15, 2017, now Pat. No. 10,816,495.

(Continued)

(51) Int. Cl.
*G01N 27/20* (2006.01)
*F41H 5/02* (2006.01)
(Continued)

(52) U.S. Cl.
CPC .............. *G01N 27/20* (2013.01); *F41H 5/02* (2013.01); *G06F 11/1068* (2013.01); *G11C 7/1096* (2013.01)

(58) Field of Classification Search
CPC ....... G01N 27/20; F41H 5/02; G06F 11/1068; G11C 7/1096; G11C 2029/5002; G11C 5/005; G11C 29/52
(Continued)

(56) References Cited

U.S. PATENT DOCUMENTS 4,201,339 A * 5/1980 Gunn ..................... B07C 1/20
235/487
4,764,970 A   8/1988 Hayashi et al.
(Continued)

FOREIGN PATENT DOCUMENTS

CN      101832970 A    9/2010
CN      205003121 U    1/2016
(Continued)

OTHER PUBLICATIONS

Anatychuk, L.I., "Procedure and Equipment for Measuring Parameters of Thermoelectric Generator Modules", Journal of Electronic Materials, vol. 40, No. 5, 2011, pp. 1292-1297.
(Continued)

*Primary Examiner* — Giovanni Astacio-Oquendo
(74) *Attorney, Agent, or Firm* — Sriram Srinivasan; Thomas M. Spielbauer

(57) ABSTRACT

An armor piece may include a tested material. The armor piece also may include a plurality of electrical contacts distributed about and electrically connected to the tested material. The armor piece further may include a non-volatile memory (NVM) device. The NVM device may be hardened against exposure to x-ray radiation. The NVM device may be configured to store control voltages associated with respective electrical contacts of the plurality of electrical contacts.

18 Claims, 10 Drawing Sheets

Related U.S. Application Data

(60) Provisional application No. 62/435,394, filed on Dec. 16, 2016.

(51) Int. Cl.
*G06F 11/10* (2006.01)
*G11C 7/10* (2006.01)

(58) Field of Classification Search
USPC .................................. 324/693, 691, 649, 600
See application file for complete search history.

(56) References Cited

U.S. PATENT DOCUMENTS

| | | | |
|---|---|---|---|
| 4,777,357 A * | 10/1988 | Harada | G06K 19/14 235/494 |
| 4,785,243 A | 11/1988 | Abramczyk et al. | |
| 4,914,378 A | 4/1990 | Hayashi et al. | |
| 5,258,708 A | 11/1993 | Sadeghi et al. | |
| 6,150,809 A | 11/2000 | Tiernan et al. | |
| 6,210,972 B1 | 4/2001 | Williams et al. | |
| 6,218,846 B1 | 4/2001 | Ludwig et al. | |
| 6,288,528 B1 | 9/2001 | Goodstein et al. | |
| 6,476,624 B1 | 11/2002 | Chuman et al. | |
| 6,922,641 B2 | 7/2005 | Batzinger et al. | |
| 7,161,356 B1 | 1/2007 | Chien | |
| 7,443,177 B1 | 10/2008 | Bowler | |
| 7,596,470 B2 | 9/2009 | Kim | |
| 7,705,589 B2 | 4/2010 | Kim et al. | |
| 8,327,306 B2 | 12/2012 | Oh et al. | |
| 8,552,752 B2 | 10/2013 | Qiu | |
| 8,624,401 B2 | 1/2014 | Ishikawa | |
| 8,816,705 B2 | 8/2014 | Espejord | |
| 9,037,430 B1 | 5/2015 | Wiggins et al. | |
| 2002/0024346 A1 | 2/2002 | Ikuta et al. | |
| 2003/0184321 A1 | 10/2003 | Hands | |
| 2004/0021461 A1 | 2/2004 | Goldfine et al. | |
| 2004/0241890 A1 | 12/2004 | Steele et al. | |
| 2005/0251062 A1 | 11/2005 | Cho et al. | |
| 2006/0283262 A1 | 12/2006 | Smits et al. | |
| 2008/0001608 A1 | 1/2008 | Sauliner et al. | |
| 2008/0191706 A1 | 8/2008 | Burnett et al. | |
| 2009/0121727 A1 | 5/2009 | Lynch et al. | |
| 2009/0192730 A1 | 7/2009 | Tada | |
| 2009/0202387 A1 | 8/2009 | Dlugos, Jr. et al. | |
| 2011/0060536 A1 | 3/2011 | Feng | |
| 2011/0179553 A1 * | 7/2011 | Hazlett | A41F 9/002 2/311 |
| 2012/0013483 A1 | 1/2012 | Jung et al. | |
| 2012/0024346 A1 | 2/2012 | Bystrom et al. | |
| 2012/0153740 A1 | 6/2012 | Soar | |
| 2012/0177177 A1 | 7/2012 | Masters | |
| 2012/0235693 A1 | 9/2012 | Feng | |
| 2012/0261039 A1 * | 10/2012 | Cho | C22F 1/053 148/697 |
| 2013/0307566 A1 | 11/2013 | Malone et al. | |
| 2014/0062521 A1 | 3/2014 | Yamada | |
| 2014/0152336 A1 | 6/2014 | Sasaki et al. | |
| 2014/0354307 A1 | 12/2014 | Clarke et al. | |
| 2015/0095000 A1 | 4/2015 | Patil et al. | |
| 2015/0184394 A1 * | 7/2015 | Nark | H05B 3/56 52/302.1 |
| 2015/0204701 A1 | 7/2015 | Klicpea | |
| 2015/0285697 A1 * | 10/2015 | O'Bier, II | A63B 71/00 2/411 |
| 2015/0308980 A1 | 10/2015 | Bittar et al. | |
| 2016/0163607 A1 | 6/2016 | Oh et al. | |
| 2017/0167927 A1 | 6/2017 | Carkner | |

FOREIGN PATENT DOCUMENTS

| | | |
|---|---|---|
| JP | S56-012544 A | 2/1981 |
| JP | S62-047544 A | 3/1987 |
| JP | H03-056848 A | 12/1991 |
| JP | H05-288706 A | 2/1993 |
| WO | WO 89/012833 A1 | 12/1989 |
| WO | WO 2007/075243 A1 | 7/2007 |
| WO | WO 2013086626 A1 | 6/2013 |

OTHER PUBLICATIONS

Aselage, T.L., et al., "Large Enhancement of Boron Carbides' Seebeck Coefficients through Vibrational Softening" Physical Review Letters, vol. 81, No. 11, 1998, pp. 2316-2319.

Hartov, Alex, et al. "Using voltage sources as current drivers for electrical impedance tomography", Measurement Science and Technology, vol. 13, 2002, pp. 1425-1430.

International Search Report for PCT International Application No. PCT/US2017/66590, dated Jul. 24, 2018, 2 pages.

Lazarovitch, R., et al., "Experimental crack identification using electrical impedance tomography", NDT&E International, vol. 35, No. 5, pp. 301-316, Jul. 1, 2002.

Paraskevopoulous, I., "Solar Soldier: Virtual Reality Simulations and Guidelines for the Integration of Photovoltaic Technology on the Modern Infantry Soldier", School of Engineering and Design, Brunel University, U.K. 141-154.

Ruan, Tao, "Development of an Automated Impedance Tomography System and Its Implementation in Cementitious Materials", Clemson University—TigerPrints, All Dissertations Paper 1756, 2016, pp. 24-49.

Sauliner, Gary J., et al. "A high-precision voltage source for ETI", Physiological Measurement, Institute of Physics Publishing, Bristol, GB, vol. 27, No. 5, May 1, 2006, pp. S221-S236 (XP020105771).

Steinitz, Avital A. "Optimal Camera Placement." 2012 Thesis. (http://www.eecs.berkeley.edu/Pubs/TechRpts/2012/EECS-2012-69.pdf).

Valiant, Leslie G. "The Complexity of Enumeration and Reliability Problems," *SIAM Journal on Computing*, vol. 8, Issue 3, 1979, pp. 410-421.

Zaoui, Abdelhalim "Inverse Problem in Nondestructive Testing Using Arrayed Eddy Current Sensors", Sensors, 2010, vol. 10, p. 8696-8704.

* cited by examiner

VERIFYING STRUCTURAL INTEGRITY OF MATERIALS

CROSS REFERENCE TO RELATED APPLICATIONS

This application is a continuation of U.S. patent application Ser. No. 16/470,064 filed 14 Jun. 2019, now granted U.S. Pat. No. 10,816,495 issued on 27 Oct. 2020, which is a US 371 Application based on International Application No. PCT/US17/66590 filed on 15 Dec. 2017 which claims the benefit of Provisional U.S. Patent Application No. 62/435,394 filed 16 Dec. 2016, the entire disclosures of all of which are incorporated by reference herein.

TECHNICAL FIELD

The disclosure relates to techniques for verifying structural integrity of materials.

BACKGROUND

Many materials are useful when their mechanical properties remain intact, but less useful when damaged, such as when cracked. Thus, detection of whether these materials are damaged is important. As one example, ceramic body plating is used to protect soldiers, police officers, and other security personnel from projectiles. Ceramic body plating may be useful when undamaged, but may be replaced after being damaged, e.g., after cracking.

X-ray scanning, including X-ray radiography and X-ray computed tomography (CT scanning) may be used to detect cracks or other defects in materials. However, such techniques may utilize large and heavy scanners, which may not be easily portable. Further, X-ray scanning and X-ray CT scanning may be relatively expensive, relatively slow, or both.

SUMMARY

In some examples, the disclosure describes an armor piece that includes a tested material; a plurality of electrical contacts distributed about and electrically connected to the tested material; and a non-volatile memory (NVM) device. The NVM device may be hardened against exposure to x-ray radiation.

In some examples, the disclosure describes a measurement system that includes an armor piece and a controller. The armor piece may include a tested material; a plurality of electrical contacts distributed about and electrically connected to the tested material; and a NVM device. The NVM device may be hardened against exposure to x-ray radiation, and the NVM device is configured to store data comprising control voltage values associated with the tested material. The controller may be configured to cause an electrical signal to be applied to a pair of drive electrical contacts from the plurality of electrical contacts; cause a measured voltage to be determined using a measurement electrical contact from the plurality of electrical contacts; retrieve a control voltage value from the NVM device; and determine whether the tested material includes a crack or other defect based on the measured voltage and the control voltage.

In some examples, the disclosure describes a method that includes attaching a plurality of electrical contacts to a tested material. An armor piece may include the tested material. The method also may include attaching a NVM device to the tested material. The NVM device may be hardened against exposure to X-ray radiation. The method further may include writing a plurality of control voltage values to the NVM device.

In some examples, the disclosure describes a method that includes retrieving a plurality of control voltage values from a NVM device attached to an armor piece including a tested material. The method also may include causing the tested material to be exposed to X-ray radiation. The method further may include writing the plurality of control voltage values to the NVM device.

The techniques described herein may provide one or more advantages. For example, using a measurement system in which a NVM device is attached to the tested material may allow control voltage values associated with the tested material to be kept with the tested material. Further, as the NVM device may be hardened against exposure to X-ray radiation, the tested material also may be tested using X-ray radiography or X-ray computed tomography testing while reducing a likelihood that control voltage values stored by the NVM device suffer errors due to exposure to X-ray radiation. This may facilitate use of measurement systems described herein, which may offer improved portability and cost compared to an X-ray radiography or X-ray computed tomography system, while offering sufficient accuracy and detail to enable detection of cracks or other defects in a tested material being used in the field.

The details of one or more examples are set forth in the accompanying drawings and the description below. Other features, objects, and advantages will be apparent from the description and drawings, and from the claims.

DETAILED DESCRIPTION

Figure 1:
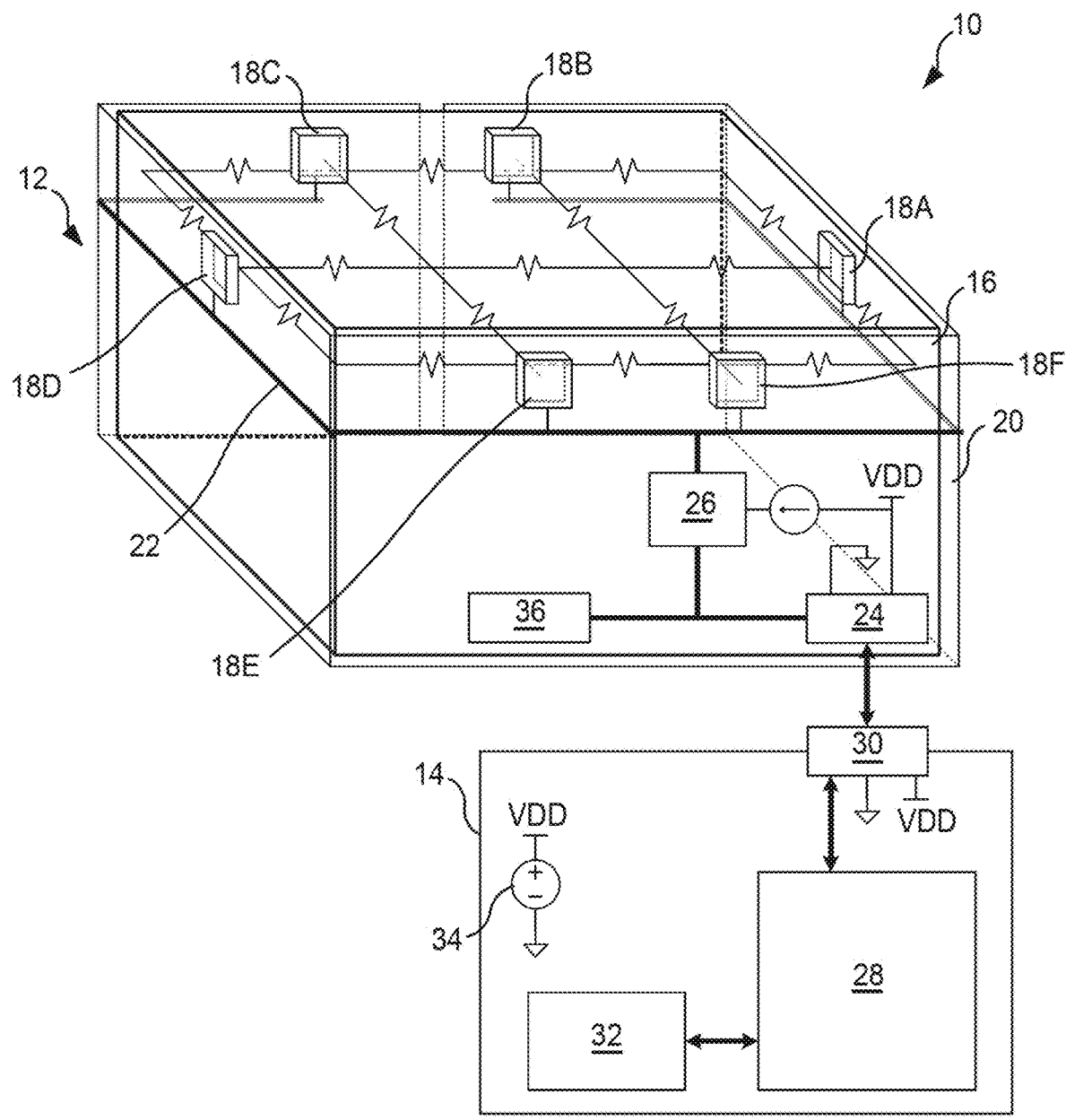
FIGS. 1-3 are a conceptual and schematic block diagrams illustrating example measurement systems for determining whether an armor piece including a tested material includes a crack or other defect, in which a NVM device that is hardened against X-ray radiation is attached to the tested material.

The disclosure describes armor pieces, measurement systems, and techniques for verifying structural integrity of a tested material, in which the armor piece includes a non-volatile memory (NVM) device configured to store at least one control voltage associated with the armor piece. The techniques may include determining whether the armor piece includes a crack or other defect based on a comparison between at least a measured voltage associated with the armor piece and a control voltage associated with the armor piece. In some examples, the control voltage may be determined for the same armor piece when the material is known to be intact (undamaged), the control voltage may be determined using a model of the armor piece in an intact (undamaged) state, or the control voltage may be determined as an average (e.g., mean) of a plurality of similar armor pieces (e.g., in geometry and composition) that are known to be intact (undamaged).

In some examples, the NVM device may be hardened to X-ray radiation using one or more techniques. A NVM device that is hardened to X-ray radiation is less likely than a non-X-ray radiation hardened memory device to develop a data error in response to exposure to X-ray radiation. For example, the NVM device may include a memory technology that inherently possesses some X-ray radiation resistance, such as magnetoresistive random access memory (MRAM), giant magnetoresistive random access memory (GMRAM), ferroelectric random access memory (FRAM), silicon-on-insulator metal-oxide-semiconductor (SOI MOS) memory, phase change random access memory (PRAM), chalcogenide random access memory (C-RAM), or carbon nanotube-based random access memory (NRAM). As another example, the NVM device may be coated with or encapsulated in a shielding material that shields the NVM device from x-ray radiation. Additionally or alternatively, the NVM device may include primary memory cells and redundant memory cells configured to store first and second copies of the same data, respectively, may execute error-correcting code (ECC) to recover data that includes a predetermined number of errors, may be attached to a tested material of the armor piece so that a major surface of the NVM device is perpendicular to a major surface of the tested material, or the like.

An NVM device that is hardened to X-ray radiation may allow X-ray radiography or X-ray computed tomography (CT) techniques to be used to test the armor piece, while reducing or substantially eliminating introduction of errors into data stored by the NVM device due to X-ray radiography or X-ray CT testing. For example, control voltages may be stored to the NVM device during manufacture of the armor piece. Later, prior to distributing the armor piece to customers or end users, or prior to incorporating the armor piece into a larger product, the armor piece may be inspected using X-ray radiography or X-ray CT testing to verify integrity of the armor piece. In other examples, the armor piece may be exposed to X-ray radiography or X-ray CT testing during distribution or after the armor piece has been incorporated in a larger product. In any case, using a NVM device that is hardened to X-ray radiation may reduce a chance that this later exposure to X-ray radiation will introduce errors into the control voltage data stored by the NVM device.

Additionally, storing control voltages used to determine whether the armor piece includes a crack or other defect in a NVM device attached to the armor piece may maintain association between the control voltages and the armor piece by the physical association. This may be simpler than storing control voltages in another device (e.g., a testing device), a server, the cloud, or the like, as no logical associations between a set of control voltages and an armor piece may be required. Further, in comparison to X-ray radiography or X-ray CT, the systems and techniques described herein utilize relatively smaller, relatively less expensive testing equipment, which may be portable.

FIG. 1 is conceptual and schematic diagram block illustrating an example measurement system 10 for determining whether a tested material 16 includes a crack or other defect. Measurement system 10 includes an armor piece 12 and a measurement device 14. Armor piece 12 may include tested material 16, a plurality of electrical contacts 18A-18F (collectively, "electrical contacts 18"), a substrate 20, a contact routing bus 22, a first electrical connector 24, a programmable switch array 26 and a NVM device 36. Measurement device 14 may include a controller 28, a second electrical connector 30, a user interface 32, and a voltage source 34.

Armor piece 12 includes tested material 16. Tested material 16 may possess protective properties, such as relatively high hardness, a relatively high Young's modulus, a relatively high tensile strength, so that armor piece 12 functions as armor. As tested material 16 functions as armor, tested material 16 may be useful when intact and less useful when a potential crack or other defect is present. Tested material 16 may include a metal, an alloy, a metalloid, a semiconductor, an electrically conductive or semiconductive ceramic, a dielectric, or the like. In some examples, tested material 16 may include a ceramic such as boron carbide ($B_4C$), silicon carbide (SiC), alumina ($Al_2O_3$), composites thereof, or the like. In some examples, tested material 16 may be electrically conductive or electrically semiconductive.

Armor piece 12 and tested material 16 may define any geometry, and the geometry of armor piece 12 and tested material 16 may be based at least in part on the intended use for armor piece. For example, ceramic armor plating may have a geometry defined by the surface that the armor plating will be applied to. Example geometries for armor piece 12 and tested material 16 include, but are not limited to, polygonal solids, such as rectangular solids or solids with more sides.

Armor piece 12 also includes a plurality of electrical contacts 18. Plurality of electrical contacts 18 may include an electrically conductive material, such as, for example, an electrically conductive metal or alloy. Each of plurality of electrical contacts 18 may be electrically connected to tested material 16 using any suitable type of electrical coupling, including, for example, an electrically conductive adhesive, an electrically conductive solder, embedding electrical contacts 18 in tested material 16, a dielectric coupling via capacitive coupling, or the like.

Each respective electrical contact may be positioned at a selected location of tested material 16. Electrical contacts 18 may be attached to any surface of tested material 16.

The surface to material electrical contacts 18 are attached may affect the direction in which the electrical field extends and current flows within tested material 16 (e.g., when selected sets of electrical contacts 18 are used as drive electrical contacts). Cracks or other defects may affect the magnitude of the voltage more significantly when the electrical field and current flow extends across a plane of the crack (e.g., normal to a surface of the crack). As such, in some examples, the likely locations of cracks or other defects and the likely orientation of cracks or other defects within tested material 16 may be predicted based on the use for tested material 16. In some of these examples, electrical contacts 18 may then be attached to tested material 16 so that the electrical field and current flow within tested material 16 extends substantially normal to a predicted orientation of the crack or other defect.

In some examples, rather than predicting a location of the crack or other defect within tested material 16 and placing electrical contacts 18 based on the prediction, electrical contacts 18 may be attached to more than one surface of tested material 16. For example, if tested material 16 is in the shape of a cube or polygonal solid, electrical contacts 18 may be attached to surfaces that define a selected perimeter of the cube or polygonal solid, as shown in FIG. 1. Other examples are possible for other shapes. In some examples, electrical contacts 18 are distributed across a surface area of tested material 16. In other examples, electrical contacts 18 are distributed around a perimeter of tested material 16, as shown in FIG. 1. In some examples, plurality of electrical contacts 18 may be referred to as a set of N electrical contacts 18.

Armor piece 12 also may optionally include a substrate 20. Substrate 20 may include a flex circuit, a printed circuit board (PCB), or the like, to which electronic and electrical components may be mounted and electrically connected. For example, substrate 20 may include an electrically insulating material that provides mechanical support for substrate 20 and a plurality of electrically conductive traces that electrically connect components mounted or connected to substrate 20. The electrically insulating material may include, for example, a polymer, ceramic, or other dielectric material. For instance, a flex circuit may include a flexible plastic, such as a polyimide, a polyester, a polyether ether ketone (PEEK), or the like. A PCB may include, for example, a glass epoxy, a phenolic material, a polyimide, a polyester, or the like. In some examples, the PCB may include a reinforcement material, such as paper, fiberglass, or the like, impregnated or coated with a glass epoxy, a phenolic material, a polyimide, a polyester, or the like. The conductive traces in the PCB or flex circuit may include, for example, copper, silver, aluminum, or the like.

Armor piece 12 further may include first electrical connector 24. First electrical connector 24 provides electrical connection between armor piece 20 and measurement device 14, e.g., via connection to second electrical connector 30. As such, first electrical connector 24 and second electrical connector 30 may conform to the same connector configuration and have complementary electrical and mechanical connections. First electrical connector 24 may be physically mounted to substrate 20 and electrically connected to one or more electrically conductive traces in or on substrate 20. In some examples, first electrical connector 24 is configured to support digital signals for communication between article 20 and measurement device 14.

Armor piece 12 additionally may optionally include a programmable switch array 26. Programmable switch array 26 includes a plurality of inputs and a plurality of outputs, with respective inputs electrically coupled to each respective output by a network of programmable switches. For example, programmable switch array 26 may include inputs electrically connected to contact routing bus 22, and outputs electrically connected to first electrical connector 24. In some examples, programmable switch array 26 may include at least as many inputs as there are electrical contacts 18. For example, in the example shown in FIG. 1, article 12 includes six electrical contacts 18, and programmable switch array 26 thus may include at least six inputs.

In some examples, rather than including a single programmable switch array 26 may include multiple programmable switch arrays, such as a first programmable switch array connected to a voltage or current source, a second programmable switch array connected to a return or ground, a third programmable switch array connected to a first input of controller 28 or an analog-to-digital converter (not included in FIG. 1), and a fourth programmable switch array connected to a second input of controller 28 or an analog-to-digital converter (not included in FIG. 1).

Armor piece 12 also may include a contact routing bus 22, which electrically connects respective electrical contacts of electrical contacts 18 to programmable switch array 26. Contact routing bus 22 may be formed by electrical traces on or in substrate 20.

Armor piece 12 further may include a NVM device 36. NVM device 36 may be physically attached to substrate 20 and electrically connected to first electrical connector 24, e.g., by electrical traces on or in substrate 20.

NVM device 36 may include any type of non-volatile memory. For example, NVM device 36 may including at least one of erasable programmable read-only memory (EPROM), electrically erasable programmable read-only memory (EEPROM), flash memory, magnetoresistive random-access memory (MRAM), giant magnetoresistive random access memory (GMRAM), ferroelectric random access memory (FRAM), silicon-on-insulator metal-oxide-semiconductor (SOI MOS) memory, phase change random access memory (PRAM), chalcogenide random access memory (C-RAM), or carbon nanotube-based random access memory (NRAM).

NVM device 36 may be configured to store a set of control voltages associated with armor piece 12. A control voltage may represent the voltage measured for a given combination of a pair of drive electrical contacts and a measurement electrical contact when tested material 16 does not include a crack or other defect. The control voltage may be based on tested material 16, a model, or an average of a plurality of materials that are similar to or substantially the same as tested material 16. For example, the control voltage may be determined at a time at which tested material 16 is manufactured, or a time at which an independent measurement (e.g., X-ray radiology or X-ray CT scan) may be used to verify that tested material 16 is intact, undamaged, or does not include a crack. In some examples, the control voltage may be determined by causing an electrical signal to be applied to a pair of drive electrical contacts from electrical contacts 18 and determining the measured voltage using a measurement electrical contact from electrical contacts 18. In some examples, the control voltage may be determined using similar or substantially the same combinations of pairs of drive electrical contacts and measurement electrical contacts as are used to determine the measured voltages described below. In this way, respective measured voltages may be compared to a control voltage associated with the same pair of drive electrical contacts and measurement electrical contact used to determine the measured voltage to determine whether tested material 16 includes a crack or other defect.

In other examples, the control voltage may be determined using a model of tested material 16 in an intact (undamaged) state. For example, controller 28 or another computing device may execute the model of tested material 16 and determine the control voltage(s) based on the model. In some examples, the model may include a physics-based model of the electrical properties of tested material 16. In some other examples, the control voltage(s) may be determined as an average (e.g., mean) of a plurality of similar materials (e.g., in geometry and composition) that are known to be intact (undamaged). The control voltage(s) may be stored in NVM device 36 for later use.

In some examples, NVM device 36 may include one or more features or technologies that hardens NVM device 36 against X-ray radiation. As described above, in some examples, prior to distributing armor piece 12 to customers or end users, or prior to incorporating the armor piece into a larger product, such as an armored vehicle or a set of body armor, armor piece 12 may be inspected using X-ray radiography or X-ray CT testing to verify integrity of armor piece 12. In other examples, armor piece 12 may be exposed to X-ray radiography or X-ray CT testing during distribution or after armor piece 12 has been incorporated in a larger product. In any case, using NVM device 36 that is hardened to X-ray radiation may reduce a chance that this later exposure to X-ray radiation will introduce errors into the data stored by NVM device 36.

In some examples, the memory technology used by NVM device 36 may provide hardening against X-ray radiation. For example, NVM device 36 may include MRAM, GMRAM, FRAM, SOI MOS memory, PRAM, C-RAM, or NRAM, each of which may be less likely to develop errors upon being exposed to X-ray radiation, e.g., compared to EPROM, EEPROM, or flash memory.

In some examples, a physical configuration of NVM device 36 may provide hardening against X-ray radiation. For example, NVM device 36 may be coated with a shielding material that absorbs or reflects at least some X-ray radiation. Example shielding materials may include tantalum, tungsten, lead, or the like. In some implementations, the shielding material coating may be provided on one or more surfaces of NVM device 36 on which X-ray radiation is expected to be incident. For example, the orientation of armor piece 12 when undergoing X-ray radiography and X-ray CT testing may be known, and the surface or surfaces of NVM device 36 that will face the X-ray radiography and X-ray CT device may be coated with the shielding material. In other examples, NVM device 36 may be substantially fully enclosed or encapsulated in the shielding material (e.g., aside from electrical contacts between NVM device 36 and substrate 20).

As another example, NVM device 36 may be attached to tested material 16 (e.g., via substrate 20) so that a major surface of NVM device 36 is perpendicular to a major surface of tested material 16. Such a configuration is illustrated in FIG. 1. This configuration may reduce or minimize a cross-sectional area of NVM device that is exposed to X-ray radiation during any X-ray radiography and X-ray CT testing of armor piece 12. For example, during X-ray radiography and X-ray CT testing, the major surface of armor piece 12 may be oriented toward the X-ray source, such that X-ray radiation is directed perpendicular to the major surface of armor piece 12. By attaching NVM device 36 to tested material 16 (e.g., via substrate 20) so that a major surface of NVM device 36 is perpendicular to a major surface of tested material 16, X-ray radiation may be substantially parallel to the major surface of NVM device 36, reducing a cross-sectional area of NVM device 36 that is exposed to X-ray radiation, and reducing a chance that X-ray radiation induces an error in data stored by NVM device 36.

In some examples, NVM device 36 may implement at least one technique to reduce an effect of any errors caused by exposure of NVM device 36 to X-ray radiation. For example, NVM device 36 may be configured to store multiple copies of data to provide redundancy for the data. In this way, by including multiple copies of the data, a likelihood that at least one copy of the data that is without errors or with a number of errors that is below a number of errors recoverable by error-correcting code (ECC) exists in NVM device 36 is increased. In some examples, NVM device 36 may include a set of primary memory cells that stores a first copy of data (e.g., control voltages) and at least one set of redundant memory cells that stores a second copy of the same data (e.g., control voltages).

Additionally or alternatively, NVM device 36 may be configured to perform ECC on data stored by NVM device 36 to recover data that includes up to a predetermined number of errors, where the predetermined number of errors is set by the strength of the ECC. ECC may include, for example, block code ECC (such as Reed-Solomon codes, Golay codes, BCH codes, multidimensional parity codes, Hamming codes, low-density parity-check (LDPC), and the like), convolutional code ECC (such as Viterbi codes), or the like.

In some examples, NVM device 36 may implement two or more of the techniques or features for hardening against X-ray radiation. For example, NVM device 36 may include at least one physical feature (e.g., memory type, shielding material, or physical orientation) and at least one technique to reduce an effect of errors (e.g., ECC, data redundancy).

Further, in some in examples, in addition to or instead of NVM device 36 performing ECC, controller 28 may perform ECC on data received from NVM device 36. For example, controller 28 may include additional computing resources, which may allow controller 28 to perform more powerful (e.g., correct more errors) ECC than NVM device 36.

Measurement device 14 may include second electrical connector 30. Second electrical connector 30 provides electrical connection between armor piece 12 and measurement device 14, e.g., via connection to first electrical connector 24. As such, first electrical connector 24 and second electrical connector 30 may conform to the same connector configuration and have complementary electrical and mechanical connections. Second electrical connector 30 may be physically mounted to a substrate (e.g., a PCB) and electrically connected to one or more electrically conductive traces in or on the substrate. In some examples, second electrical connector 30 is configured to support digital signals for communication between armor piece 12 and measurement device 14.

Measurement device 14 also includes a voltage source 34. Voltage source 34 may provide electrical power for operation of measurement system 10, e.g., for operation of controller 28 and the electrical signal applied to a pair of drive electrical contacts from electrical contacts 18 during testing. Voltage source 34 may include any device configured to output an electrical signal. The electrical signal may include an alternating current (AC) signal or a direct current (DC) signal. In some examples, voltage source 34 may include a power source, such as a battery, a capacitor, a supercapacitor, a transformer electrically connected to a mains voltage, or the like. In some examples, in addition to the power source, voltage source 34 may include analog or digital circuitry configured to receive the electrical signal from the power source and modify the electrical signal into a format suitable for output to components of measurement system 10.

Measurement device 14 further includes a user interface (UI) device 32. UI device 32 may include an output device, and input device, or both. Input devices may include, for example, buttons, switches, a touchscreen, or the like. Output devices may include, for example, a light or light emitting diode (LED), a display, a speaker, a haptic device, or another device configured to output visible, audible, or perceivable information.

Figure 3:
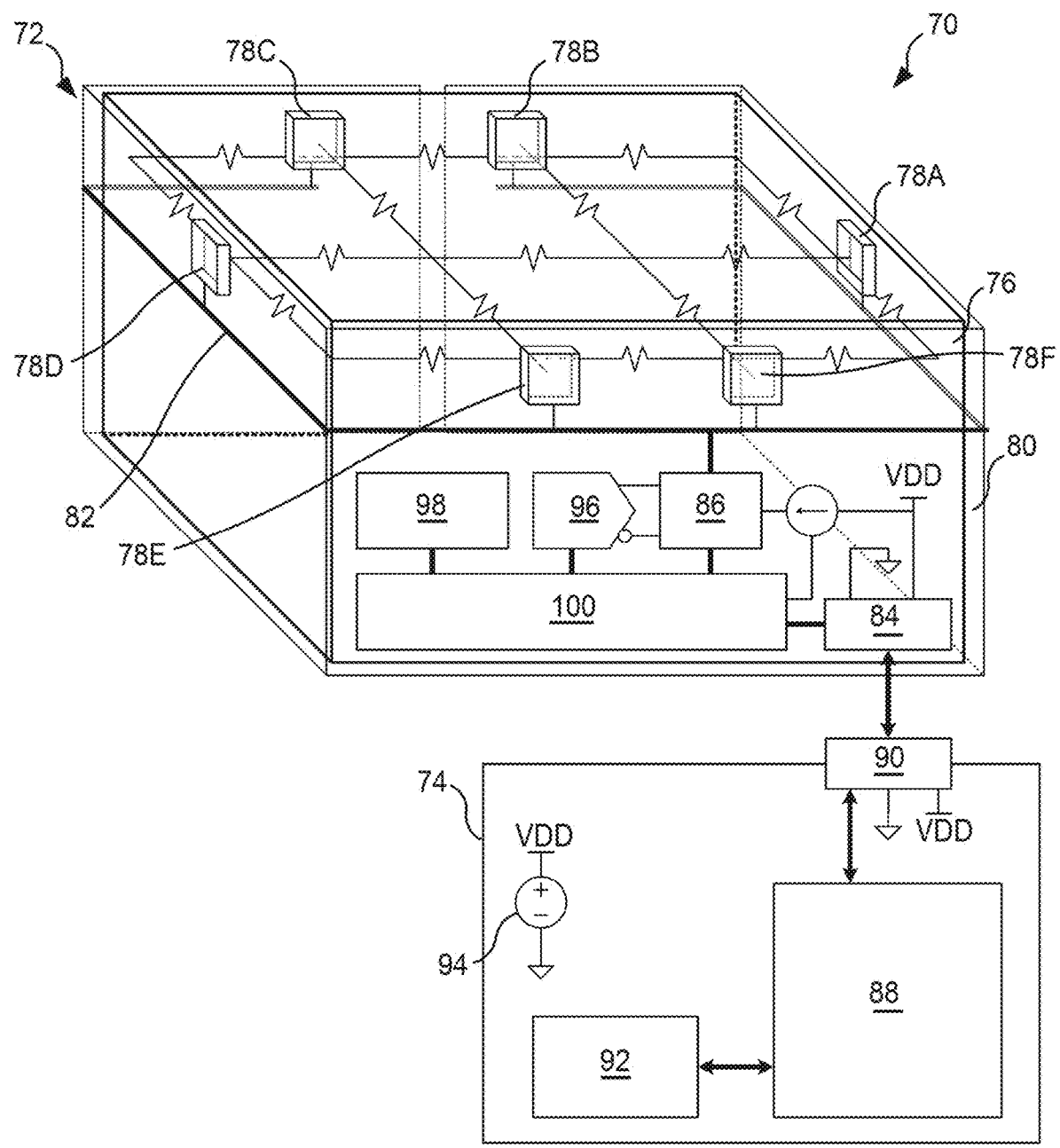

Measurement device 14 also may include a controller 28. Controller 28 is configured to control operation of measurement system 10, including UI device 32 and programmable switch array 26. Controller 28 may include, for example, a processor. The processor may include one or more microprocessors, digital signal processors (DSP), application specific integrated circuits (ASIC), field programmable gate arrays (FPGA), or other digital logic circuitry. In some examples, controller 28 may include an analog-to-digital converter (ADC), or measurement system 10 may include an ADC separate from controller 28 (e.g., as shown in FIG. 3). The ADC may measure the voltage using the selected measurement electrical contact, e.g., under control of controller 28.

Controller 28 is electrically coupled to UI device 32 and programmable switch array 26 either directly or indirectly via electrical connectors 24 and 30. Controller 28 may be configured to control programmable switch array 26 to electrically connect selected electrical contacts of electrical contacts 18 to serve as a pair of drive electrical contacts, such that the electrical signal is output to the pair of drive electrical contacts.

Controller 28 is also configured to cause programmable switch array 26 to connect a selected pair of electrical contacts 18 or one of electrical contacts 18 and a reference electrode to controller 28 to serve as a pair of measurement electrical contacts. In this way, controller 28 may determine a voltage across a pair of measurement electrical contacts in response to the electrical signal output to the pair of drive electrical contacts.

In some examples, measurement system 10 may optionally include a reference electrode, which may not be electrically coupled to tested material 16 and may be used for single-ended voltage measurements between one electrical contact of plurality of electrical contacts 18 and the reference electrode. The reference electrode may be at a selected voltage, such a ground or an offset voltage. In some examples, controller 28 may use the single-ended voltages in the techniques described herein to determine whether tested material 16 includes a crack or other defect. In other examples, controller 28 may determine differential voltages between two electrical contacts electrically coupled to tested material 16 by comparing (e.g., subtracting) single ended voltages associated with the two electrical contacts, and controller 28 may use these differential voltages in the techniques described herein to determine whether material 16 includes a crack or other defect. In still other examples, controller 28 may determine a voltage between two of electrical contacts 18 directly, e.g., without first determining two single-ended voltages.

To determine one or more voltages to be used to determine whether tested material 16 includes a crack or other defect, controller 18 is configured to cause programmable switch array 26 to connect a pair of electrical contacts from electrical contacts 18 to voltage source 34 to act as a set of drive electrical contacts. Controller 18 may cause voltage source 34 to output the electrical signal to the set of drive electrical contacts. As electrical contacts 18 are electrically coupled to tested material 16, the output electrical signal may pass through the set of drive electrical contacts and through tested material 16.

Controller 28 may be configured to also cause programmable switch array 26 to connect controller 28 to two of electrical contacts 18 or one of electrical contacts 18 and a reference electrode as measurement electrical contacts, and may determine a measured voltage in response to the electrical signal applied to the set of drive electrical contacts using the measurement electrical contacts. For example, in some implementations, controller 28 may cause the measurement electrical contacts to be electrically connected to an analog-to-digital converter, which may be used to determine the measured voltage. As electrical contacts 18 are electrically coupled to tested material 16, electrical contacts 18 may be used to determine a voltage in tested material 16.

In some examples, controller 28 may be configured to cause switch network 26 to sequentially connect respective measurement electrical contacts (each including either two of electrical contacts 18 or one of electrical contacts 18 and a reference electrode as measurement electrical contacts), and controller 28 may determine a respective measured voltage in response to the electrical signal using each of the respective measurement electrical contacts. Controller 28 may repeat this process of causing an electrical signal to be applied to a set of drive electrical contacts and determining at least one respective measured voltage for any selected number of measurement electrical contacts for each set of drive electrical contacts, and for any selected number of drive electrical contacts.

Once controller 28 has determined or received at least one measured voltage associated with a respective measurement electrical contact, controller 28 may utilize the measured voltage in combination with a control voltage retrieved from NVM device 36 to determine whether tested material 16 includes a crack or other defect. For example, controller 28 may determine a difference or ratio between a magnitude of the measured voltage associated with a measurement electrical contact of electrical contacts 18 and a magnitude of the control voltage associated with the same measurement electrical contact. Controller 28 then may compare this difference or ratio to a threshold voltage value or threshold ratio, and may determine that tested material 16 includes a crack or other defect in response to the difference being greater than the threshold voltage value or threshold ratio.

In some examples in which controller 28 receives or determines multiple measured voltages and retrieves multiple measured voltages from NVM device 36, controller 28 may compare each respective, measured voltage with a corresponding (i.e., associated with the same pair of drive electrodes and the same measurement electrode) control voltage. As an example, controller 28 may subtract the corresponding control voltage from the respective measured voltage or determine a ratio between the respective measured voltage and the corresponding control voltage. In some examples, controller 28 may compare the respective voltage difference or respective voltage ratio to a threshold voltage value or a threshold voltage ratio.

The threshold voltage value or ratio may be selected so that a voltage difference or ratio above the threshold voltage value is meaningful (e.g., indicative of a crack or other defect) and a voltage difference below the threshold voltage value is not meaningful (e.g., is not indicative of a crack or other defect). In some examples, the threshold value may be selected to be a voltage value that is slightly greater than a noise floor of the measurement, such that any voltage difference that exceeds the noise floor is determined by controller 28 to be indicative of a crack or other defect.

In some examples, after comparing each respective measurement voltage against a corresponding control voltage and comparing the difference to the threshold voltage value to determine if the respective measurement voltage is indicative of a crack or other defect, computing device 32 may determine whether a crack or other defect is present in material 36 based on the plurality of indications. For example, computing device 32 may determine a number of differences that are indicative of a crack and compare this number of differences to a threshold number of differences to determine if material 36 includes a crack or other defect.

As another example, controller 28 may determine whether tested material 16 includes a crack or other defect by determining an overall score for tested material 16. For example, controller 28 may sum all ratios associated with a respective measurement electrical contact to generate a single value associated with each respective measurement electrical contact. Controller 28 then may mathematically manipulate these values to arrive at a single score for tested material 16. For example, controller 28 may sum the ratios, take each ratio to a predetermined power and sum the products, average the ratios, determine a weighted average of the ratios, or the like to determine a single score for testing material 16. Controller 28 then may compare the single score to a threshold score value and determine that tested material 16 includes a crack or other defect if the single score is greater than the threshold score value.

In this way, measurement system 10 may utilize control voltages stored by NVM device 36 to determine whether tested material 16 includes a crack or other defect. By storing control voltages in NVM device 36, the control voltages may be physically connected to armor piece 12 and easily accessible without needing to connect to a remote device (e.g., a server or other computing device or the cloud) to retrieve the control voltages. This may facilitate testing of armor piece 12 at locations at which access to remote computing devices, e.g., via a network of the internet, is not available or reliable. Further, by utilizing an NVM device 36 that is hardened against X-ray radiation, NVM device 36 may more reliably store the control voltages, e.g., even in examples in which armor piece 36 may be exposed to X-ray radiation during manufacture, shipping, or use.

Figure 2:
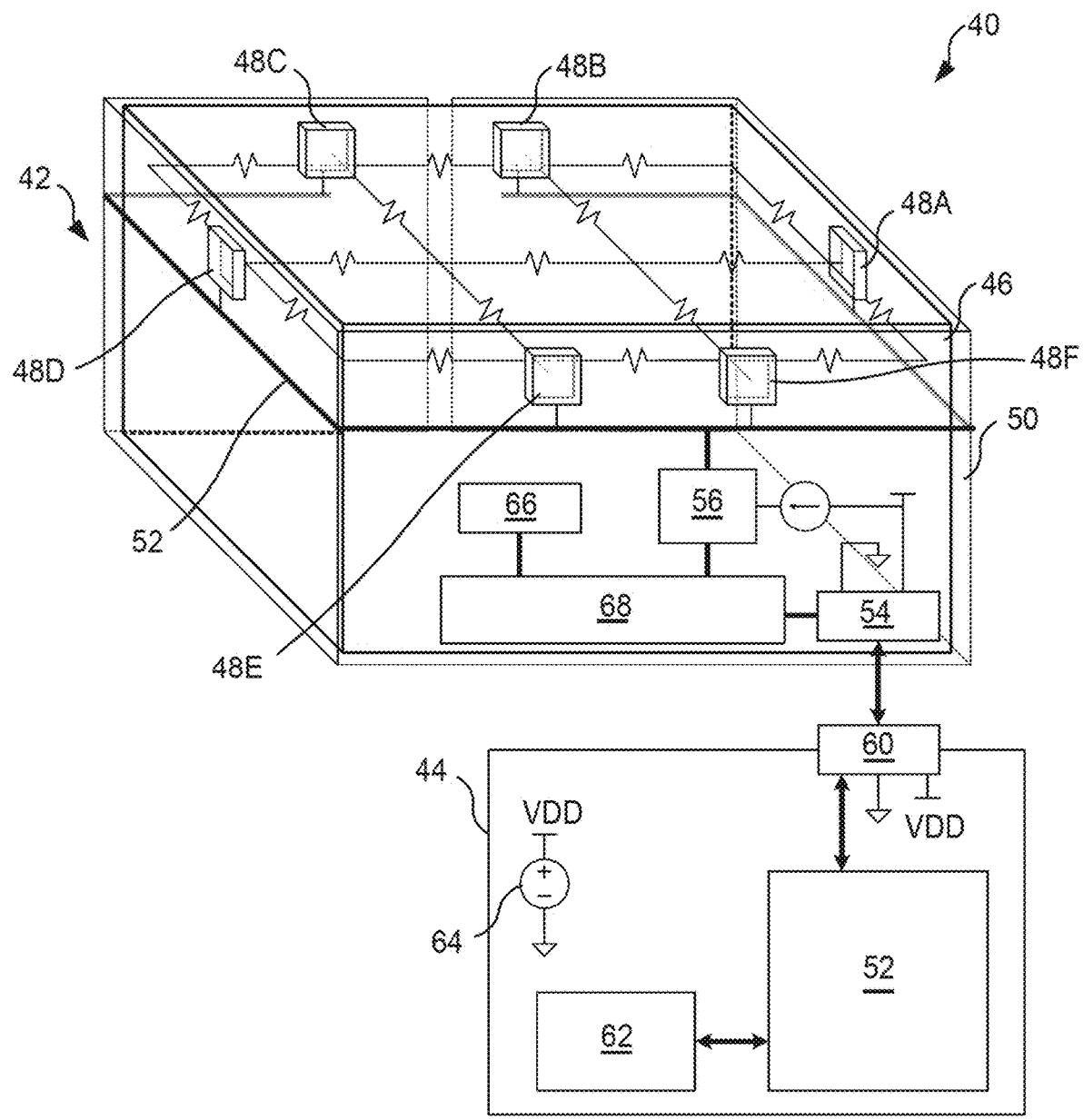

In some examples, a measurement system may include a different configuration of components, may include additional components, or the like. FIG. 2 is a conceptual and schematic block diagram illustrating another example measurement system 40 for determining whether a tested material 46 includes a crack or other defect. In many respects measurement system 40 is similar to measurement system 10 of FIG. 1. For example, measurement system 40 includes an armor piece 42 and a measurement device 44. Armor piece 42 may be similar to article 12 of FIG. 1 and measurement device 44 may be similar to measurement device 14 of FIG. 1, aside from the differences described herein.

Similar to article 12 of FIG. 1, article 42 includes tested material 46, a plurality of electrical contacts 48, a substrate 50, a contact routing bus 52, a first electrical connector 54, a programmable switch array 56, and a NVM device 66. Each of these components may be similar to or substantially the same as the corresponding components described with reference to FIG. 1.

Similar to measurement device 14 of FIG. 1, measurement device 44 of FIG. 2 includes a controller 58, a second electrical connector 60, a user interface device 62, and a voltage source 64. Each of these components may be similar to or substantially the same as the corresponding components described with reference to FIG. 1.

Unlike measurement system 10 of FIG. 1, in measurement system 40, article 42 includes a data communication and control device 68. Data communication and control device 68 is electrically connected to first electrical connector 54, programmable switch array 56, and NVM 66.

In measurement system 40, controller 58 controls overall operation of system 40. Controller 58 may communicate commands to data communication and control device 68 via first connector 54 and second connector 60. Data communication and control device 68 then controls programmable switch array 56 and NVM 66 based on the commands received from controller 58. Further, once data communication and control device 68 determines measured voltages for one or more pair of measurement electrical contacts from electrical contacts 48, data communication and control device 68 may communicate the measured voltages to controller 58. Controller 58 then may determine whether tested material 46 includes a crack or other defect based on the measured voltages and control voltages retrieved from NVM device 66 via data communication and control device 68.

In some examples, a measurement system may include one or more additional components that may facilitate the measurement techniques described herein. For example, FIG. 3 is a conceptual and schematic block diagram illustrating another example measurement system 70 for determining whether a tested material 76 includes a crack or other defect. In many respects measurement system 70 is similar to measurement system 40 of FIG. 2. For example, measurement system 70 includes an armor piece 72 and a measurement device 74. Aside from the differences described herein, armor piece 72 may be similar to armor piece 42 of FIG. 2 and measurement device 74 may be similar to measurement device 44 of FIG. 2.

Similar to armor piece 42 of FIG. 2, armor piece 72 includes tested material 76, a plurality of electrical contacts 78, a substrate 80, a contact routing bus 82, a first electrical connector 84, a programmable switch array 86, a NVM device 98, and a data communication and control device 100. Each of these components may be similar to or substantially the same as the corresponding components described with reference to FIG. 2.

Similar to measurement device 44 of FIG. 2, measurement device 74 of FIG. 3 includes a controller 88, a second electrical connector 90, a user interface device 92, and a voltage source 94. Each of these components may be similar to or substantially the same as the corresponding components described with reference to FIG. 2.

Unlike measurement system 40 of FIG. 2, in measurement system 70, armor piece 72 also includes an analog-to-digital converter (ADC) 96. Armor piece 72 includes ADC 96, which may be attached to substrate 80 and electrically connected to programmable switch array 86 and data communication and control device 100 using electrical traces in or on substrate 80. ADC 96 may include at least a control input electrically connected to controller 88, which allows data communication and control device 100 to control operation of ADC 96 and read data from ADC 96, and at least one signal input electrically connected to programmable switch array 86. In some examples, ADC 96 includes one signal input electrically connected to programmable switch array 86 and one connection to ground and measured single ended voltages. In other examples, ADC 96 is a differential ADC and includes two signal inputs electrically connected to programmable switch array 86. FIG. 3 illustrates the latter configuration in which ADC 96 is a differential ADC. ADC 96 may be a differential ADC, which accepts two input signals and digitizes the voltage difference between the two input signals.

Under control of controller 88, data communication and control device 100 may be configured to cause programmable switch array 86 to connect a selected pair of electrical contacts 78 or one of electrical contacts 78 and a reference electrode to ADC 96 to serve as a pair of measurement electrical contacts. For example, data communication and control device 100 may cause programmable switch array 86 to connect a first electrical contact of electrical contacts 78 to a first input of ADC 96 (e.g., a positive input) and connect a second electrical contact of electrical contacts 78 or a reference electrode to a second input of ADC 96 (e.g., a negative input). In this way, ADC 96 may determine a measured voltage across a pair of measurement electrical contacts in response to an electrical signal output to a pair of drive electrical contacts. In order to determine a respective voltage for each of a plurality of measurement electrical contacts, data communication and control device 100 may cause programmable switch array 86 to connect a first pair of measurement electrical contacts to ADC 96, cause ADC 96 to measure a first measured voltage using the first pair of measurement electrical contacts, cause programmable switch array 86 to connect a second pair of measurement electrical contacts to ADC 96, cause ADC 96 to measure a second measured voltage using the second pair of measurement electrical contacts, and so on.

Data communication and control device 100 may retrieve the measured voltage determined by ADC 96 and communicate the measured voltage or measured voltages to controller 88. Controller 88 may determine whether tested material 76 includes a crack or other defect based on the measured voltage(s) and control voltage(s) retrieved from NVM device 98 via data communication and control device 100.

Figure 4:
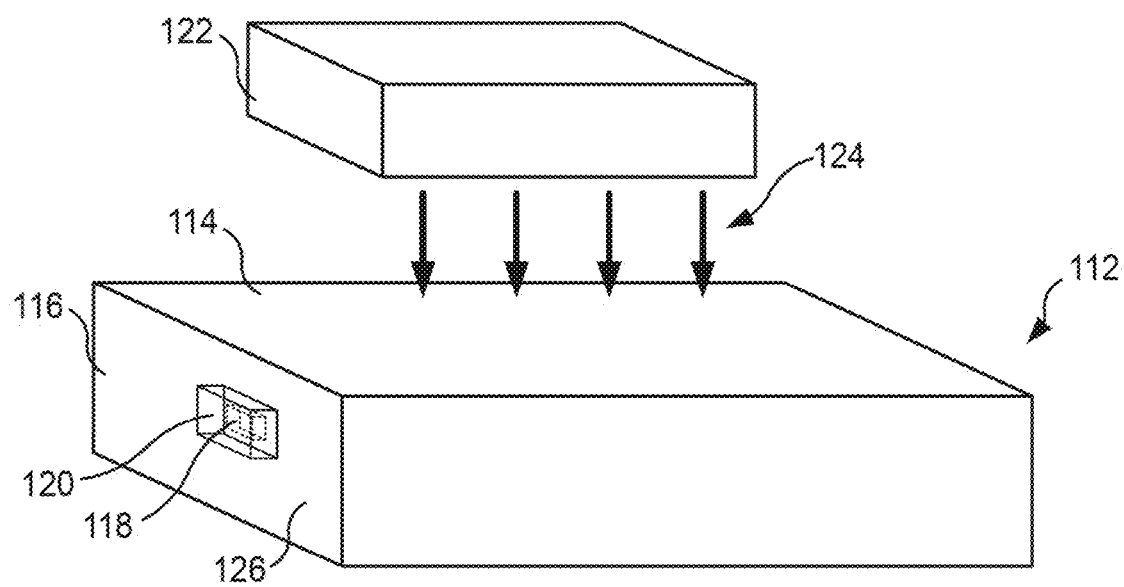
FIG. 4 is a conceptual and schematic diagram illustrating an example armor piece that includes a tested material and an attached NVM device.

As described briefly above, NVM devices used herein may include at least one feature or implement at least one technique to provide hardening against X-ray radiation. FIG. 4 is a conceptual and schematic diagram illustrating an example armor piece 112 that includes a tested material 116 and an attached NVM device 118. As shown in FIG. 4, armor piece 112 defines a major surface 114 (which may by the major surface of tested material 116). During X-ray radiography or X-ray CT testing, an X-ray source 122 may direct X-ray radiation 124 in a direction substantially perpendicular to major surface 114 of armor piece 112. NVM device 118 is attached to a side 126 of armor piece 112 or tested material 116 other than major surface 114 of armor piece 112. As shown in FIG. 4, a major surface of NVM device 118 is oriented substantially perpendicular to major surface 114 of armor piece 112, and substantially parallel to a direction in which X-ray source 122 emits X-ray radiation 124. Attaching NVM device 118 to tested material 116 so that a major surface of NVM device 118 is substantially perpendicular to a major surface of tested material 116, may reduce a cross-sectional area of NVM device 118 that is exposed to X-ray radiation 124 and reduce a chance that X-ray radiation 124 induces an error in data stored by NVM device 118.

FIG. 4 also illustrates NVM device 118 as being at least partially enclosed or encapsulated by a shielding material 120. Shielding material 120 may absorb or reflect at least some X-ray radiation 124. Examples of shielding material 120 may include tantalum, tungsten, lead, or the like. In some implementations, shielding material 120 may be provided on one or more surfaces of NVM device 118 on which X-ray radiation 124 is incident. In some examples, NVM device 118 may be substantially fully enclosed or encapsulated in the shielding material 120 (e.g., aside from electrical contacts between NVM device 118 and a substrate).

Figure 5:
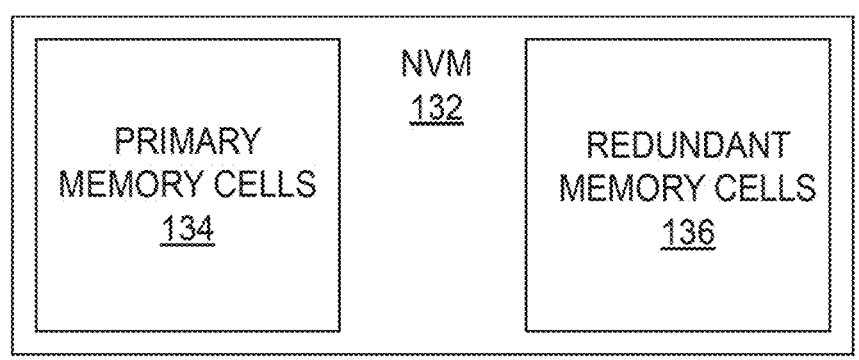
FIG. 5 is a conceptual and schematic block diagram illustrating an example NVM device that includes primary memory cells and redundant memory cells.

FIG. 5 is a conceptual and schematic block diagram illustrating an example NVM device 132 that includes primary memory cells 134 and redundant memory cells 136. By including multiple copies of data (e.g., one copy in primary memory cells 134 and one copy in redundant memory cells 136), a likelihood that at least one copy of the data that is without errors or with a number of errors that is below a number of errors recoverable by error-correcting code (ECC) exists in NVM device 132 is increased.

Figure 6:
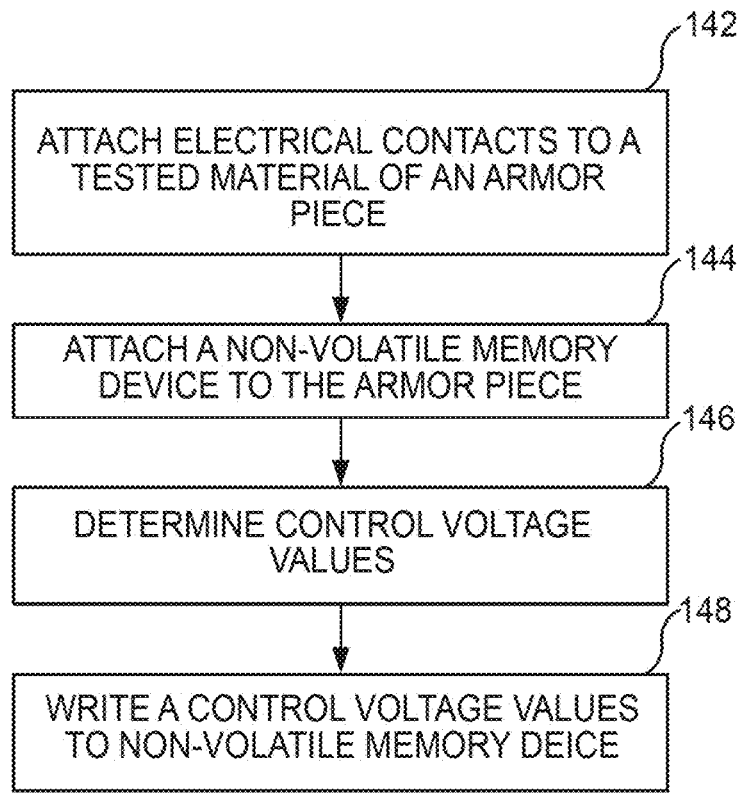
FIG. 6 is flow diagram illustrating an example technique for forming an armor piece that includes an attached NVM device and storing control voltage values to the NVM device.

FIG. 6 is flow diagram illustrating an example technique for forming an armor piece that includes an attached NVM device and storing control voltage values to the NVM device. The technique of FIG. 6 will be described with concurrent reference to measurement system 10 of FIG. 1, but it will be understood that the technique of FIG. 6 may be performed on other systems (e.g., measurement system 40 of FIG. 2 or measurement system 70 of FIG. 3), and that measurement system 10 may be formed using other techniques.

The technique of FIG. 6 includes attaching a plurality of electrical contacts 18 to a tested material 16 of an armor piece 12 (142). Plurality of electrical contacts 18 may be attached and electrically coupled to tested material 16 using any suitable type of electrical coupling, including, for example, an electrically conductive adhesive, an electrically conductive solder, embedding electrical contacts 18 in tested material 16, a dielectric coupling via capacitive coupling, or the like. Further, as described above, electrical contacts 18 may be located at any suitable position on tested material 16.

The technique of FIG. 6 also includes attaching NVM device 36 to armor piece 12 (144). Attaching NVM device 36 to armor piece 12 may include (144) physically attaching NVM device 36 to substrate 20, which is attached to tested material 16. Attaching NVM device 36 to armor piece (144) also may include electrically connecting NVM device 36 to electrical traces in or on substrate 20. In this way, NVM device 36 may be electrically connected to, for example, first electrical connector 24, data communication and control device 68 (FIG. 2) or 100 (FIG. 3), and the like. In some examples, NVM device 36 may be electrically connected to NVM device 36 using, for example, surface-mount technology, such as wire bonds, flip chip bonding, or the like.

The technique of FIG. 6 further may include determining a plurality of control voltage values for tested material 16 (146). In some examples, the plurality of control voltage values may be determined by controller 28. For example, controller 28 may cause an electrical signal to be applied to a set of drive electrical contacts. For instance, controller 28 may output a control signal to cause programmable switch array 26 to electrically connect a selected set of electrical contacts 18 to a current source or to voltage source 34 to serve as a set of drive electrical contacts.

The selected set of electrical contacts 18 may include any two or more electrical contacts of electrical contacts 18. In some examples, the selected set of electrical contacts 18 may be adjacent to each other; in other examples, the selected set of electrical contacts 18 may be spaced apart. For example, in some instances, the selected set of electrical contacts 18 may be substantially opposite each other in the array of electrical contacts 18, or may be separated by a predetermined number of electrical contacts 18, e.g., separated by two electrical contacts of electrical contacts 18. In some examples, the set of electrical contacts 18 may include two electrical contacts that are on a symmetry of tested material 16.

Controller 28 then may cause the electrical signal to be applied to the first set of drive electrical contacts, e.g., via programmable switch array 26. The electrical signal may include an AC signal or a DC signal, and may include a current signal or a voltage signal. In some examples, the type of electrical signal may depend on the composition of tested material 26. For example, a DC signal may be used to measure a voltage of an electrically conductive or electrically semiconductive material, while an AC signal may be used to measure a voltage of an electrically conductive material, an electrically semiconductive material, or a dielectric material. Controller 28 also may control the amplitude, duration, frequency, and other signal characteristics of the electrical signal. The electrical signal may be generated by voltage source 34 or current source (illustrated in FIG. 1 adjacent to programmable switch array 26).

While the electrical signal is being applied to the set of drive electrical contacts, controller 28 may cause a measured voltage to be determined using a measurement electrical contact electrically coupled to tested material 16. For example, controller 28 may output a control signal to cause programmable switch array 26 to electrically connect a selected pair of electrical contacts 18 or an electrical contact and a reference electrode to controller 28 to serve as a set of measurement electrical contacts.

The selected pair of measurement electrical contacts may be any two electrical contacts from electrical contacts 18, neither of which is being used as one of the electrical contacts in the set of drive electrical contacts, or may be a reference electrode and any one of electrical contacts 18 that is not being used as one of the electrical contacts in the set of drive electrical contacts. In some examples, the two electrical contacts in the pair of measurement electrical contacts may be adjacent to each other. In other examples, the two electrical contacts in the pair of measurement electrical contacts may be spaced each other with one or more electrical contacts between. Using adjacent electrical contacts as the pair of measurement electrical contacts may result in a higher signal-noise-ratio in the voltage measurement, but may reduce an area of tested material 16 for which the voltage is measured. Regardless of the particular electrical contacts coupled to controller 28, controller 28 may determine a voltage using the measurement electrical contacts while the electrical signal is being applied to the set of drive electrical contacts.

In some examples, controller 28 may be configured to determine a respective measured voltage for a plurality of measurement electrical contacts for each pair of drive electrical contacts. Hence, in some examples, controller 28 may determine whether there is an additional measurement electrical contact for which to determine a measured voltage for the selected pair of drive electrical contacts. In response to determining that there is an additional electrical contact to be used as a measurement electrical contact, controller 28 may cause programmable switch network 26 to couple the selected electrical contacts to controller 28. Controller 28 then may determine a measured voltage using the selected measurement electrical contact.

Controller 28 may repeat this determination of whether additional electrical contacts 18 are to be used as a measurement electrical contact, causing coupling of a selected measurement electrical contact to controller 28 using switch network 26, and determining a respective measured voltage until controller 28 determines there are no additional electrical contacts 18 to be used as a measurement electrical contact for the selected pair of drive electrical contacts. In some examples, multiple electrical contacts may be used as sets of drive electrical contacts, and controller 28 may determine whether there is an additional pair of drive electrical contacts to which to apply the electrical signal. For example, controller 28 may be configured to utilize each unique pair of electrical contacts from electrical contacts 18 or each unique pair of electrical contacts separated by a predetermined number of electrical contacts (e.g., two electrical contacts) as a pair of drive electrical contacts. In other examples, only a single pair of electrical contacts 18 may be utilized as a pair of drive electrical contacts, and controller 28 may not determine whether there is an additional pair of drive electrical contacts to which to cause the electrical signal to be applied.

For each pair of drive electrodes, controller 28 may cause coupling of a selected measurement electrical contact to controller 28 using switch network 26, determine a measured voltage using a measurement electrical contact, determine whether additional electrical contacts 18 are to be used as a measurement electrical contact, cause coupling of a selected measurement electrical contact to controller 28 using switch network 26, and determine a respective measured voltage until controller 28 determines there are no additional electrical contacts 18 to be used as a measurement electrical contact for the selected pair of drive electrical contacts.

Controller 28 then may write the determined control voltage values to NVM device 36 (148).

Figure 7:
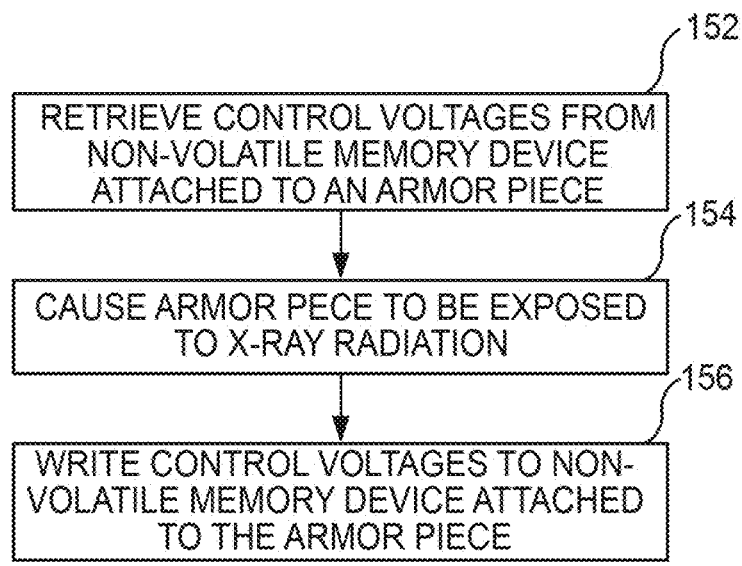
FIG. 7 is a flow diagram illustrating an example technique for exposing an armor piece to testing using X-ray radiation.

FIG. 7 is a flow diagram illustrating an example technique for exposing an armor piece to testing using X-ray radiation. The technique of FIG. 7 may be used to reduce a likelihood that testing armor device 12 using X-ray radiation induces errors in control voltage data stored NVM device 36. The technique of FIG. 7 will be described with reference to the conceptual and schematic diagram of FIG. 4, but it will be understood that other systems may perform the technique of FIG. 7.

The technique of FIG. 7 includes retrieving control voltages from NVM device 118 attached to armor piece 112 (152). For example, an external computing device that is part of an X-ray radiography and X-ray CT system may be attached to an electrical connector attached to armor piece 112 and may retrieve the control voltages from NVM device 118.

The technique of FIG. 7 also may include causing armor piece 112 to be exposed to X-ray radiation, e.g., as part of an X-ray radiography and X-ray CT test (154). For example, an external computing device, such as the external computing device that retrieved the control voltages from NVM device 36, may cause armor piece 112 to be exposed to X-ray radiation (154). The armor piece 112 may be exposed to X-ray radiation to determine whether tested material 116 includes a crack or other defect.

The technique of FIG. 7 further includes writing control voltages to NVM device 118 (156). In this way, control voltages may be read from NVM device 118, stored external to armor piece 112 during testing of armor piece 112 with X-ray radiation, then rewritten to NVM device 118 after testing is complete. This may avoid the chance of corrupting the control data by exposure to X-ray radiation.

Figure 8:
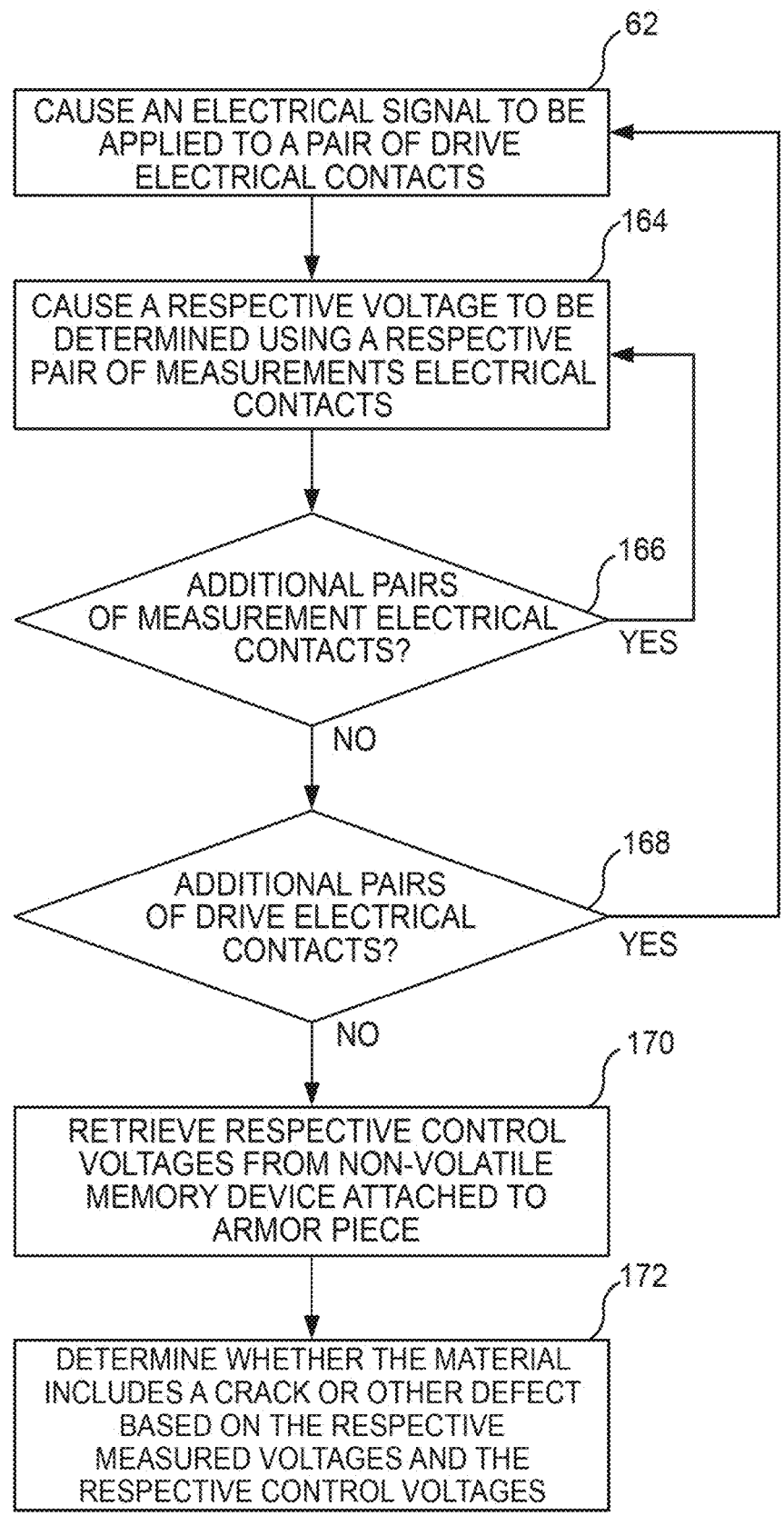
FIG. 8 is a flow diagram illustrating an example technique for determining whether an armor piece including a tested material includes a crack or other defect utilizing control voltage values stored in a NVM device attached to the tested material.

FIG. 8 is flow diagram illustrating an example technique for determining whether a tested material includes a crack or other defect. The technique of FIG. 8 will be described with concurrent reference to measurement system 70 of FIG. 3, but it will be understood that other systems may perform the technique of FIG. 8 (e.g., system 10 of FIG. 1 or system 40 of FIG. 2), and that measurement system 70 may be used to perform other techniques.

The technique of FIG. 8 optionally includes coupling a measurement device 74 to armor piece 72. Measurement device 74 may be coupled to armor piece 72 using electrical connectors 84 and 90.

Once measurement device 74 is coupled to armor piece 72, the technique of FIG. 8 may include causing, by controller 88, an electrical signal to be applied to a set of drive electrical contacts (162). For example, controller 88 may output a control signal to data communication and control device 100 that instructs data communication and control device 100 to cause programmable switch array 86 to electrically connect a selected set of electrical contacts 78 to a current source or to voltage source 94 to serve as a set of drive electrical contacts. Data communication and control device 100 may cause programmable switch array 86 to electrically connect the selected set of electrical contacts 78 to the current source or to voltage source 94 to serve as the set of drive electrical contacts.

The selected set of electrical contacts 78 may include any two or more electrical contacts of electrical contacts 78. In some examples, the selected set of electrical contacts 78 may be adjacent to each other; in other examples, the selected set of electrical contacts 78 may be spaced apart. For example, in some instances, the selected set of electrical contacts 78 may be substantially opposite each other in the array of electrical contacts 78, or may be separated by a predetermined number of electrical contacts 78, e.g., separated by two electrical contacts of electrical contacts 78. In some examples, the set of electrical contacts 78 may include two electrical contacts that are on a symmetry of tested material 76.

Controller 88 then may cause the electrical signal to be applied to the first set of drive electrical contacts, e.g., via programmable switch array 86. The electrical signal may include an AC signal or a DC signal, and may include a current signal or a voltage signal. In some examples, the type of electrical signal may depend on the composition of tested material 76. For example, a DC signal may be used to measure a voltage of an electrically conductive or electrically semiconductive material, while an AC signal may be used to measure a voltage of an electrically conductive material, an electrically semiconductive material, or a dielectric material. Controller 88 also may control the amplitude, duration, frequency, and other signal characteristics of the electrical signal. The electrical signal may be generated by voltage source 94 or current source (illustrated in FIG. 3 adjacent to programmable switch array 86).

The technique of FIG. 8 also includes, while the electrical signal is being applied to the set of drive electrical contacts (162), causing a measured voltage to be determined using a measurement electrical contact electrically coupled to tested material 76 (164). For example, controller 88 may output a control signal to data communication and control device 100 that instructs data communication and control device 100 to cause programmable switch array 86 to electrically connect a selected pair of electrical contacts 78 or an electrical contact and a reference electrode to ADC 96 to serve as a set of measurement electrical contacts. Data communication and control device 100 may cause programmable switch array 86 to electrically connect the selected pair of electrical contacts 78 or the selected electrical contact and the reference electrode to ADC 96 to serve as the pair of measurement electrical contacts.

The selected pair of measurement electrical contacts may be any two electrical contacts from electrical contacts 78 or may be a reference electrode and any one of electrical contacts 78. In some examples, the two electrical contacts in the pair of measurement electrical contacts may be adjacent to each other. In other examples, the two electrical contacts in the pair of measurement electrical contacts may be spaced from each other with one or more electrical contacts between. Using adjacent electrical contacts as the pair of measurement electrical contacts may result in a higher signal-noise-ratio in the voltage measurement, but may reduce an area of tested material 76 for which the voltage is measured. Regardless of the particular electrical contacts coupled to ADC 96, controller 88 may cause ADC 96 to determine a voltage using the measurement electrical contacts (164) while the electrical signal is being applied to the set of drive electrical contacts (162).

In some examples, controller 88 may be configured to cause ADC 96 to determine a respective measured voltage for a plurality of measurement electrical contacts for each pair of drive electrical contacts. Hence, in some examples, the technique of FIG. 8 further includes determining whether there is an additional measurement electrical contact for which to determine a measured voltage (166) for the selected pair of drive electrical contacts. In response to determining that there is an additional electrical contact to be used as a measurement electrical contact, controller 88 may cause programmable switch network 86 to couple the selected electrical contacts to ADC 96. Controller 88 then may cause ADC 96 to determine a measured voltage using the selected measurement electrical contacts (164).

Controller 88 may repeat this determination of whether additional electrical contacts 78 are to be used as a measurement electrical contact (166), causing coupling of a selected measurement electrical contact to ADC 96 using switch network 86, and causing ADC 96 to determine a respective measured voltage (164) until controller 88 determines there are no additional electrical contacts 78 to be used as a measurement electrical contact for the selected pair of drive electrical contacts (the "NO" branch of decision block 166).

In some examples, the technique of FIG. 8 optionally includes determining, by controller 88, whether there is an additional pair of drive electrical contacts to which to apply the electrical signal (168). For example, controller 88 may be configured to utilize each unique pair of electrical contacts from electrical contacts 78 or each unique pair of electrical contacts separated by a predetermined number of electrical contacts (e.g., two electrical contacts) as a pair of drive electrical contacts. In other examples, only a single pair of electrical contacts 78 may be utilized as a pair of drive electrical contacts, and the technique of FIG. 8 may not include determining whether there is an additional pair of drive electrical contacts to which to cause the electrical signal to be applied (168).

For each pair of drive electrical contacts, controller 88 may cause coupling of a selected measurement electrical contact to controller 88 using switch network 86, determine a measured voltage using a measurement electrical contact, determine whether additional electrical contacts 78 are to be used as a measurement electrical contact, cause coupling of a selected measurement electrical contact to controller 88 using switch network 86, and determine a respective measured voltage until controller 88 determines there are no additional electrical contacts 78 to be used as a measurement electrical contact for the selected pair of drive electrical contacts. Once controller 88 has determined that there are no additional pairs of electrical contacts 78 to be used as a pair of drive electrical contacts (the "NO" branch of decision block 168), controller 88 may cause data communication and control device 100 to retrieve the measured voltages from ADC 96 and communicate the measured voltages to controller 88.

Controller 88 then may retrieve respective control voltages from NVM device 98 attached to armor piece 72 (170). For example, controller 88 may cause data communication and control device 100 to retrieve the control voltages from NVM 98 and communicate the control voltages to controller 88. Each respective control voltage may be associated with a pair of drive electrodes and a measurement electrode used to determine the control voltage.

Controller 88 then may determine whether tested material 76 includes a crack or other defect based on the measured voltages and the control voltages (172). For example, controller 88 may compare the respective measurement voltages to respective control voltages and determine whether tested material 76 includes a crack or other defect based on the comparison. For example, controller 88 may compare each respective measured voltage with a corresponding (i.e., associated with the same pair of drive electrical contacts and the same pair of measurement electrical contacts) control voltage. As an example, controller 88 may subtract the corresponding control voltage from the respective measured voltage. In some examples, controller 88 may compare the respective voltage difference (between the respective measurement voltage and the respective control voltage) to a threshold voltage value.

The threshold voltage value may be selected so that a voltage difference above the threshold voltage value is meaningful (e.g., indicative of a crack or other defect) and a voltage difference below the threshold voltage value is not meaningful (e.g., is not indicative of a crack or other defect). In some examples, the threshold value may be selected to be a voltage value that is slightly greater than a noise floor of the measurement, such that any voltage difference that exceeds the noise floor is determined by controller 88 to be indicative of a crack or other defect.

In some examples, after comparing each respective measurement voltage against a corresponding control voltage and comparing the difference to the threshold voltage value to determine if the respective measurement voltage is indicative of a crack or other defect, controller 88 may determine whether tested material 76 includes a crack or other defect based on the plurality of indications. For example, controller 88 may determine a number of differences that are indicative of a crack and compare this number of differences to a threshold number of differences to determine if tested material 76 includes a crack or other defect.

In some examples, rather than utilizing differences between a measured voltage and a corresponding control voltage, controller 88 may determine a ratio between each respective measured voltage and a corresponding respective control voltage. In some examples, multiple electrode pair voltages may be associated with the same pair of measurement electrical contacts from electrical contacts 78, e.g., due to multiple measurements with different pairs of drive electrical contacts. In some such examples, controller 88 may determine a ratio between each respective measured voltage and the respective control voltage associated with the same pair of electrical contacts 78. By determining a ratio between the measured voltage and the control voltage, effects of temperature differences in the material between the time at which the control voltage was determined and the measured voltage was determined may be reduced.

Controller 88 may utilize the ratio(s) in one of a variety of techniques to determine whether tested material 76 includes a crack or other defect. For example, controller 88 may utilize pattern recognition. In some examples, for each measurement electrical contact from electrical contacts 78, controller 88 may sum all ratios associated with the respective measurement electrical contact. Controller 88 may then determine whether any adjacent sets of measurement electrical contacts are associated with sums that follow a predetermined pattern, such as a low-high-low pattern, a low-high-high-high-low pattern, or the like. The particular pattern that indicates that tested material 76 includes a crack or other defect may depend on positioning of electrical contacts 78, including spacing between adjacent measurement system electrical contacts of electrical contacts 78; crack location and orientation within tested material 76; and the like. In other examples, controller 88 may use pattern recognition on each set of ratios associated with a respective measurement electrical contact, and may compare the results of the various pattern recognitions to arrive at a final determination of whether tested material 76 includes a crack or other defect.

As another example, controller 88 may determine whether tested material 76 includes a crack or other defect by determining whether any of the measured voltages, ratios, or the sum of measured voltages or ratios, associated with a single pair of measurement electrical contacts, is an outlier compared to measured voltages, ratios, or sums of measured voltages or ratios, associated with other measurement electrical contacts. Cracks or other defects are expected to create regions of higher electrical resistance in tested material 76, which is expected to result in higher voltages being measured for measurement electrical contacts in which current will flow across or through regions of higher electrical resistance. Hence, an outlier of higher temperature-corrected electrode pair values indicates that tested material 76 includes a crack or other defect.

As a further example, controller 88 may determine whether tested material 76 includes a crack or other defect by determining an overall score for tested material 76. For example, controller 88 may sum all ratios associated with a respective measurement electrical contact to generate a single value associated with each respective measurement electrical contact. Controller 88 then may mathematically manipulate these values to arrive at a single score for tested material 76. For example, controller 88 may sum the ratios, take each ratio to a predetermined power and sum the products, average the ratios, determine a weighted average of the ratios, or the like to determine a single score for testing material 76. Controller 88 then may compare the single score to a threshold score value and determine that tested material 76 includes a crack or other defect if the single score is greater than the threshold score value.

As an additional example, controller 88 may calculate an approximate impedance distribution within tested material 76 to determine whether tested material 76 includes a crack or other defect (172). In some examples, reconstruction of the impedance distribution may be achieved by minimizing difference between the output of a physics-based simulation tool with the respective control voltages, and the respective measurement voltages. For example, controller 88 may be programmed with a finite element model (FEM) of tested material 76 which implements the physics-based simulation. The FEM of tested material 76 may include substantially accurate (e.g., accurate or approximately accurate) geometry of tested material 76 (e.g., the shape and volume of tested material 76), and also may include substantially accurate (e.g., accurate or approximately accurate) locations of electrical contacts 78 attached to tested material 76. In some examples, the FEM of tested material 76 may additionally include representative properties of tested material 76, including, for example, conductivity, resistivity, other related electrical properties, and the like. The FEM of tested material 76 may include representative properties of tested material 76 for each respective node representing tested material 76.

Calculating the approximate impedance distribution to determine whether tested material 76 includes a crack of other defect is an ill-posed inverse problem, in which the outputs (the respective measurement voltages) are known but the properties of tested material 76 that produce the outputs are unknown. Moreover, more than one set of properties of tested material 76 may produce the outputs. Hence, controller 88 may utilize a regularization technique to constrain the solution to solutions more likely to represent the properties of tested material 76 that would produce the respective measurement voltages.

In particular, controller 88 may generate an objective function which combines outputs of the physics-based model, respective control voltages, the respective measurement voltages, and the regularization term. For example:

$$\operatorname*{argmin}_{x}\left\{\mathcal{F}(x) := \frac{1}{2}\|f(x) - y\|_{\ell_2}^2 + \lambda \frac{1}{2}\|Rx\|_{\ell_2}^2\right\}$$

where x is the approximate change in impedance distribution, f is an operator calculating the simulated difference in voltages based on input x utilizing the physics-based simulation, y is the measured difference in voltages, $l_2$ is a chosen norm, R is the regularization matrix, and λ is the chosen weight of the regularization or regularization parameter. Controller 178 may determine respective model control voltages based on the physics-based model and inputs representative of the electrical signal(s) applied to the respective pairs of drive electrical contacts. The respective model control voltages may be associated with respective pairs of measurement electrical contacts for each respective pair of drive electrical contacts used to collect the control voltages from tested material 76. Controller 88 then may determine, using the physics-based model and inputs representative of the electrical signal(s) applied to the respective pairs of drive electrical contacts, respective model measurement voltages. The respective model measurement voltages may be associated with respective pairs of measurement electrical contacts for each respective pair of drive electrical contacts used to collect the measurement voltages from tested material 76. For each respective model measurement voltage, controller 88 may determine a respective difference between the respective model measurement voltage and the respective model control voltage (f(x) in the equation above).

Controller 88 also may determine a respective difference between the respective measurement voltage and the respective control voltage for each respective measurement voltage measured using tested material 76 to generate a set of actual voltage differences (y in the equation above).

Controller 88 then may minimize the objective function by updating one or more parameters of the physics-based model. Controller 88 may continue to iterate the model until a stopping criterion is reached. Controller 88 then may determine the approximate impedance distribution (or approximate change in impedance distribution) that is representative of the condition of tested material 76. When iteration completes the input to the model is the approximate impedance distribution.

Controller 88 may then determine whether tested material 76 includes a crack or other defect based on the approximate change in impedance distribution. For example, controller 88 may determine whether tested material 76 includes a crack or other defect based on the magnitude and location of the approximate impedance change within the material. In some examples, only the real portion of the impedance—the conductivity or resistivity—may be used by controller 88 to determine whether tested material 76 includes a crack or other defect.

In some examples, rather than utilizing respective control voltages and respective model control voltages, controller 88 may determine an approximate impedance distribution using an absolute form of the objective function, in which x is the impedance distribution, f is an operator calculating a set of the simulated voltages based on input x utilizing the physics-based simulation, y is a set of the measured voltages, $l_2$ is a chosen norm, R is the regularization matrix, and λ is the chosen weight of the regularization or regularization parameter.

In any of the techniques described herein, controller 88 may output an indication of the determination of whether tested material 76 includes a crack or other defect to user interface device 92 for output to a user. In some examples, the representation may include a simplified output, such as an indication of "Yes" or "No," "Crack" or "No Crack," "Damaged" or "Intact," or the like. The representation may be textual, icon-based, color-based, audible, haptic, or the like. For example, the representation may include a green light to represent that tested material 76 is still intact or a red light to represent that tested material 76 is damaged or includes a crack or other defect.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Clause 1: An armor piece comprising: a tested material; a plurality of electrical contacts distributed about and electrically connected to the tested material; and a non-volatile memory (NVM) device, wherein the NVM device is hardened against exposure to x-ray radiation.

Clause 2: The armor piece of clause 1, wherein the NVM device is coated with or encapsulated in a shielding material that shields the NVM device from x-ray radiation.

Clause 3: The armor piece of clause 2, wherein the shielding material comprises at least one of tantalum, tungsten, or lead.

Clause 4: The armor piece of any one of clauses 1 to 3, wherein the NVM device comprises primary memory cells and redundant memory cells configured to store first and second copies of the same data, respectively.

Clause 5: The armor piece of any one of clauses 1 to 4, wherein the NVM device comprises at least one of magnetoresistive random access memory (MRAM), giant magnetoresistive random access memory (GMRAM), ferroelectric random access memory (FRAM), SOI MOS memory, phase change random access memory (PRAM), chalcogenide random access memory (C-RAM), or carbon nanotube-based random access memory (NRAM).

Clause 6: The armor piece of any one of clauses 1 to 5, wherein the NVM device is configured to perform error correction code on data stored by the nonvolatile memory device to recover error-laden data.

Clause 7: The armor piece of any one of clauses 1 to 6, wherein the NVM device is attached to the tested material so that a major surface of the NVM device is perpendicular to a major surface of the tested material.

Clause 8: The armor piece of any one of clauses 1 to 7, wherein the NVM device is configured to store data comprising control voltages associated with the tested material for use in a crack detection technique.

Clause 9: The armor piece of any one of clauses 1 to 8, wherein the tested material comprises a ceramic.

Clause 10: The armor piece of claim 9, wherein the ceramic comprises at least one of carbide ($B_4C$), silicon carbide (SiC), alumina ($Al_2O_3$), or composites thereof.

Clause 11: The armor piece of any one of clauses 1 to 10, wherein the NVM device is electrically connected to a controller, and wherein the controller is attached to the tested material.

Clause 12: The armor piece of clause 11, wherein the controller is configured to: cause an electrical signal to be applied to a pair of drive electrical contacts from the plurality of electrical contacts; cause a measured voltage to be determined using a measurement electrical contact from the plurality of electrical contacts; retrieve a control voltage from the NVM device; and determine whether the tested material includes a crack or other defect based on the measured voltage and the control voltage.

Clause 13: The armor piece of clause 11, wherein the controller is configured to: for at least one pair of drive electrical contacts of a plurality of pairs of drive electrical contacts from the plurality of electrical contacts: cause an electrical signal to be applied to the respective pair of drive electrical contacts; for each respective measurement electrical contact of a plurality of measurement electrical contacts from the plurality of electrical contacts, cause a respective measured voltage to be determined using the respective measurement electrical contact; retrieve a plurality of respective control voltages from the NVM device, each respective control voltage associated with a respective pair of drive electrical contacts and a respective measurement electrical contact; and determine whether the tested material includes a crack or other defect based on the respective measured voltages and the respective control voltages.

Clause 14: The armor piece of any one of clauses 1 to 13, wherein the NVM device is electrically connected to an electrical connector, and wherein the electrical connector is attached to the tested material.

Clause 15: A measurement system comprising: an armor piece comprising: a tested material; a plurality of electrical contacts distributed about and electrically connected to the tested material; and a non-volatile memory (NVM) device, wherein the nonvolatile memory device is hardened against exposure to x-ray radiation, and wherein the NVM device is configured to store data comprising control voltages associated with the tested material; and a controller configured to: cause an electrical signal to be applied to a pair of drive electrical contacts from the plurality of electrical contacts; cause a measured voltage to be determined using a measurement electrical contact from the plurality of electrical contacts; retrieve a control voltage from the NVM device; and determine whether the tested material includes a crack or other defect based on the measured voltage and the control voltage.

Clause 16: The measurement system of clause 15, wherein the NVM device is coated with or encapsulated in a shielding material that shields the NVM device from x-ray radiation, and wherein the shielding material comprises at least one of tantalum, tungsten, or lead.

Clause 17: The measurement system of clause 15 or 16, wherein the NVM device comprises primary memory cells and redundant memory cells configured to store first and second copies of the same data, respectively.

Clause 18: The measurement system of any one of clauses 15 to 17, wherein the NVM device comprises at least one of magnetoresistive random access memory (MRAM), giant magnetoresistive random access memory (GMRAM), ferroelectric random access memory (FRAM), SOI MOS memory, phase change random access memory (PRAM), chalcogenide random access memory (C-RAM), or carbon nanotube-based random access memory (NRAM).

Clause 19: The measurement system of any one of clauses 15 to 18, wherein the NVM device is configured to perform error correction code on data stored by the nonvolatile memory device to recover error-laden data.

Clause 20: The measurement system of any one of clauses 15 to 19, wherein the NVM device is attached to the tested material so that a major surface of the NVM device is perpendicular to a major surface of the tested material.

Clause 21: The measurement system of any one of clauses 15 to 20, wherein the tested material comprises at least one of carbide ($B_4C$), silicon carbide (SiC), alumina ($Al_2O_3$), or composites thereof.

Clause 22: The measurement system of any one of clauses 15 to 21, wherein the controller is attached to the tested material.

Clause 23: The measurement system of any one of clauses 15 to 21, wherein the controller is separate from the armor piece.

Clause 24: The measurement system of any one of clauses 15 to 23, wherein the controller is configured to: determine whether the tested material includes a crack or other defect based on the measured voltage and the control voltage by at least determining a ratio between the measured voltage and the control voltage.

Clause 25: The measurement system of any one of clauses 15 to 24, wherein the controller is configured to: for at least one pair of drive electrical contacts of a plurality of pairs of drive electrical contacts from the plurality of electrical contacts: cause an electrical signal to be applied to the respective pair of drive electrical contacts; for each respective measurement electrical contact of a plurality of measurement electrical contacts from the plurality of electrical contacts, cause a respective measured voltage to be determined using the respective measurement electrical contact; retrieve a plurality of respective control voltages from the NVM device, each respective control voltage associated with a respective pair of drive electrical contacts and a respective measurement electrical contact; and determine whether the tested material includes a crack or other defect based on the respective measured voltages and the respective control voltages.

Clause 26: A method comprising: attaching a plurality of electrical contacts to a tested material, wherein an armor piece comprises the tested material; attaching a non-volatile memory (NVM) device to the tested material, wherein the NVM device is hardened against exposure to X-ray radiation; and writing a plurality of control voltage values to the NVM device.

Clause 27: The method of clause 26, further comprising: determining the plurality of control voltage values by at least: for each respective pair of drive electrical contacts of at least one pair of drive electrical contacts from the plurality of electrical contacts, causing a respective electrical signal to be applied to the respective pair of drive electrical contacts; and for each respective pair of drive electrical contacts, determine a respective control voltage value using a respective measurement electrical contact of a plurality of measurement electrical contacts from the plurality of electrical contacts while the electrical signal is applied to the respective pair of drive electrical contacts.

Clause 28: The method of clause 26 or 27, further comprising: coating the NVM device with or encapsulating the NVM device in a shielding material that shields the NVM device from x-ray radiation.

Clause 29: The method of clause 28, wherein the shielding material comprises at least one of tantalum, tungsten, or lead.

Clause 30: The method of any one of clauses 26 to 29, wherein writing the plurality of control voltage values to the NVM device comprises: writing a first copy of the plurality of control voltage values to primary memory cells of the NVM device; and writing a second copy of the plurality of control voltage values to redundant memory cells configured of the NVM device.

Clause 31: The method of any one of clauses 26 to 30, wherein the NVM device comprises at least one of magnetoresistive random access memory (MRAM), giant magnetoresistive random access memory (GMRAM), ferroelectric random access memory (FRAM), SOT MOS memory, phase change random access memory (PRAM), chalcogenide random access memory (C-RAM), or carbon nanotube-based random access memory (NRAM).

Clause 32: The method of any one of clauses 26 to 31, wherein the NVM device is configured to perform error correction coding on data stored by the nonvolatile memory device to recover error-laden data.

Clause 33: The method of any one of clauses 26 to 32, wherein attaching the NVM device to the tested material comprises: attaching the NVM device to the tested material so that a major surface of the NVM device is perpendicular to a major surface of the tested material.

Clause 34: The method of any one of clauses 26 to 33, wherein the tested material comprises a ceramic.

Clause 35: The method of clause 34, wherein the ceramic comprises at least one of carbide ($B_4C$), silicon carbide (SiC), alumina ($Al_2O_3$), or composites thereof.

Clause 36: The method of any one of clauses 26 to 35, further comprising: attaching a controller to the tested material; and electrically connecting the NVM device to the controller.

Clause 37: The method of clause 36, further comprising: causing, by the controller, an electrical signal to be applied to a pair of drive electrical contacts from the plurality of electrical contacts; causing, by the controller, a measured voltage to be determined using a measurement electrical contact from the plurality of electrical contacts; retrieving, by the controller, a control voltage of the plurality of control voltages from the NVM device; and determining, by the controller, whether the tested material includes a crack or other defect based on the measured voltage and the control voltage.

Clause 38: The method of claim 36, further comprising: for at least one pair of drive electrical contacts of a plurality of pairs of drive electrical contacts from the plurality of electrical contacts: causing, by the controller, an electrical signal to be applied to the respective pair of drive electrical contacts; for each respective measurement electrical contact of a plurality of measurement electrical contacts from the plurality of electrical contacts, causing, by the controller, a respective measured voltage to be determined using the respective measurement electrical contact; retrieving, by the controller, a plurality of respective control voltages from the NVM device, each respective control voltage associated with a respective pair of drive electrical contacts and a respective measurement electrical contact; and determining, by the controller, whether the tested material includes a crack or other defect based on the respective measured voltages and the respective control voltages.

Clause 39: The method of any one of clauses 26 to 38, further comprising: attaching an electrical connector to the tested material; and electrically connecting the NVM device to the electrical connector.

Clause 40: A method comprising: retrieving a plurality of control voltage values from a nonvolatile memory device attached to an armor piece comprising a tested material; causing the tested material to be exposed to X-ray radiation; and writing the plurality of control voltage values to the NVM device.

Clause 41: The method of claim 40, further comprising: in response to causing the tested material to be exposed to X-ray radiation, determining whether the tested material includes a crack or other defect.

EXAMPLES

Example 1

Figure 9:
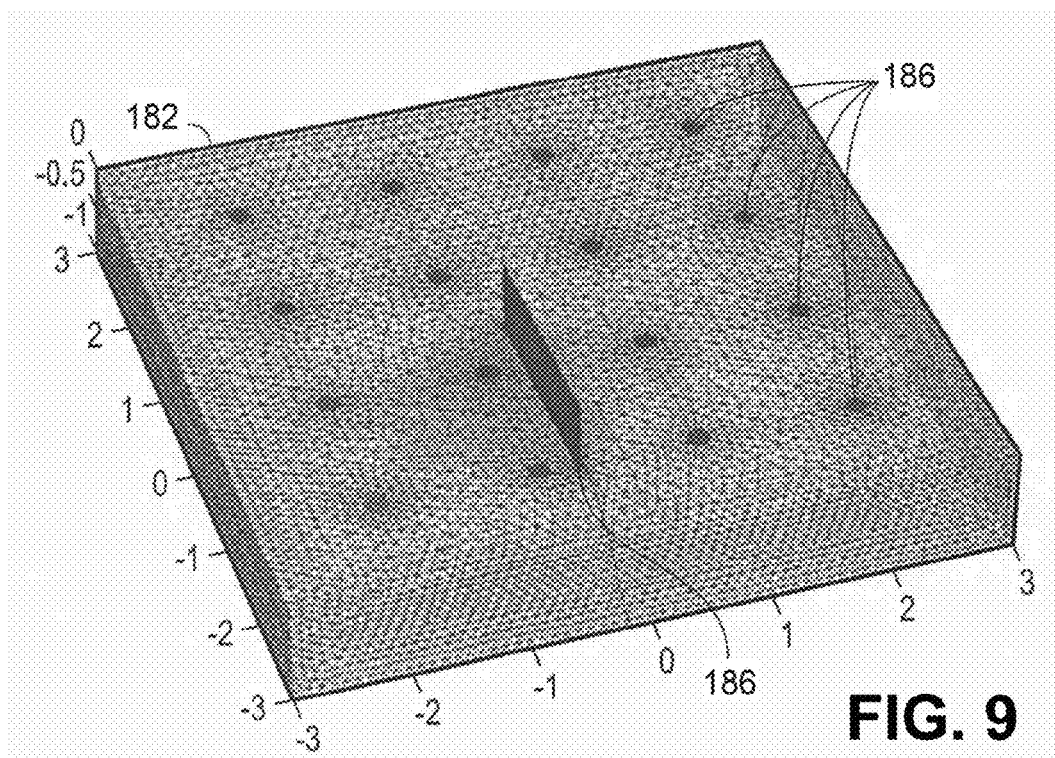
FIG. 9 is a diagram illustrating an example finite element model of a material that includes a simulated crack or other defect.

FIG. 9 is a diagram illustrating an example fine-grained FEM of a material 182 that includes a simulated crack or other defect. The fine-grained FEM includes a thin 'crack' feature 184 of low conductivity (compared to the rest of the sample) buried below the top surface of the sample and almost touching the bottom. FIG. 9 also illustrates a set of sixteen electrical contacts 186 distributed around the upper surface of material 182 (four of which are labeled in FIG. 9). A forward solution of electrical conductivity using this fine-grained FEM was used to generate the measured voltages for the cracked material. A forward solution of the same fine-grained FEM, but excluding the thin 'crack' feature 184 was used to generate the control voltages.

A coarse-grained FEM, having a coarser mesh than the fine-grained FEM, was used to reconstruct the fine-grained FEM including the crack. The electrical contact placement and geometry of the coarse-grained FEM was the same as in the fine-grained FEM. The algorithm inv_solve_diff_GN_one_step in the package Electrical Impedance Tomography and Diffuse Optical Tomography Reconstruction Software (EIDORS) was used to solve the reconstruction problem in MATLAB®. MATLAB® is available from MathWorks®, Inc., Natick, Mass., United States. EIDORS is available at eidors3d.sourceforge.net. An L-Curve method of hyperparameter selection and a Laplace filter penalty function was utilized in the EIDORS package.

Figure 10:
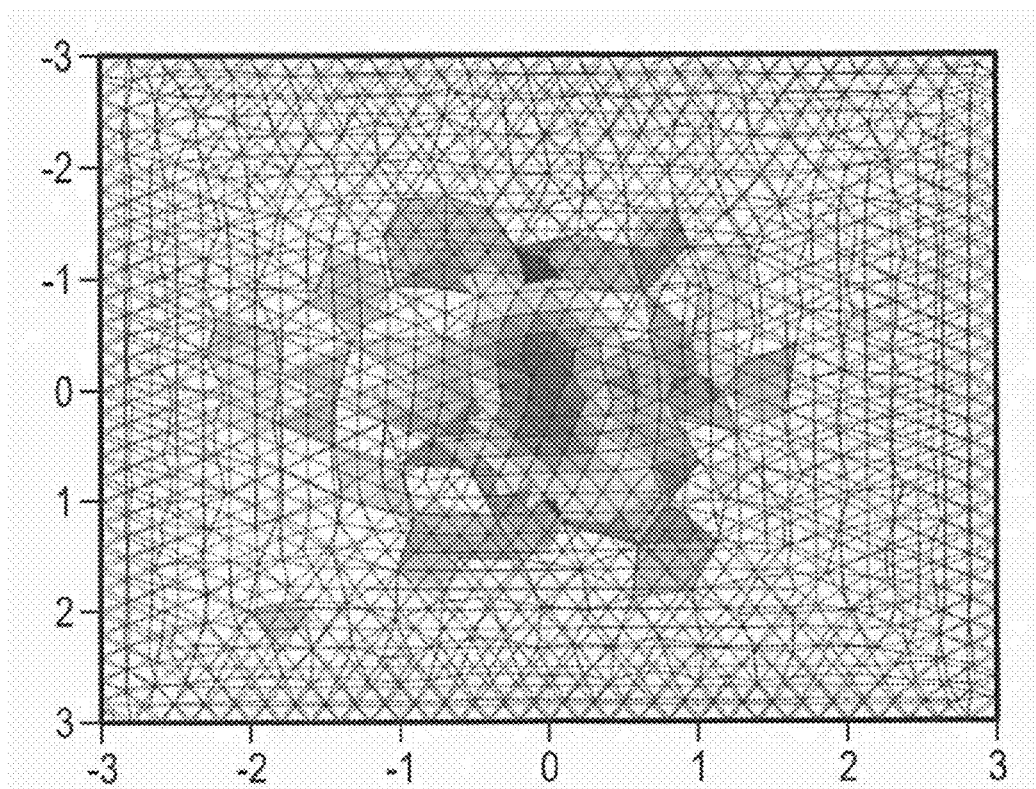
FIG. 10 is a diagram illustrating an example grayscale model output overlaid on an example finite element model of a material that includes a simulated crack or other defect.
Figure 11:
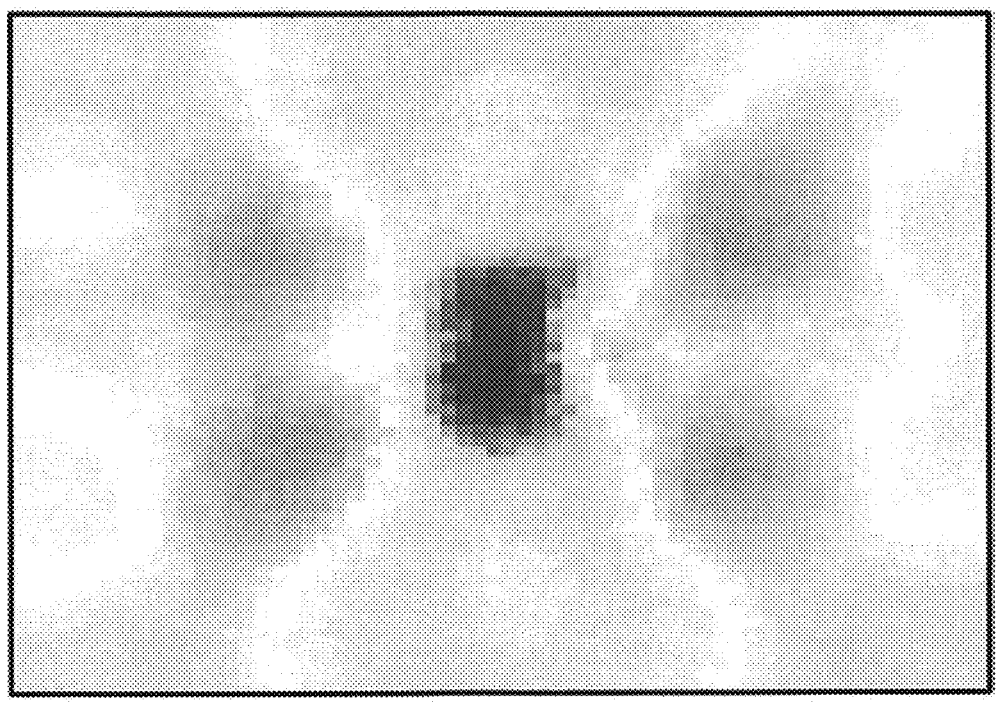
FIG. 11 is a diagram illustrating an example grayscale output of a finite element model of a material that includes a simulated crack or other defect.

FIG. 10 is a diagram illustrating an example grayscale model output overlaid on an example finite element model of a material that includes a simulated crack or other defect. The image shown in FIG. 10 is an output of the coarse-grained FEM with the physics-based model after solving the regularized least-squares minimization problem. The image shown in FIG. 10 is shown looking up at the bottom of the model. The defect is clearly detected in the sample in the center of the image. Cross-sectional images can be taken at any location within the model. FIG. 11 is a cross-sectional diagram illustrating an example grayscale output of a FEM that includes a simulated crack or other defect. This example utilized only one iteration of the Gauss-Newton algorithm and exhibits some noise surrounding the simulated crack. These artifacts can be reduced by running multiple iterations to refine the solution further (at the cost of computation time, for example between 2 and 20 iterations could be used).

Example 2

Figure 12:
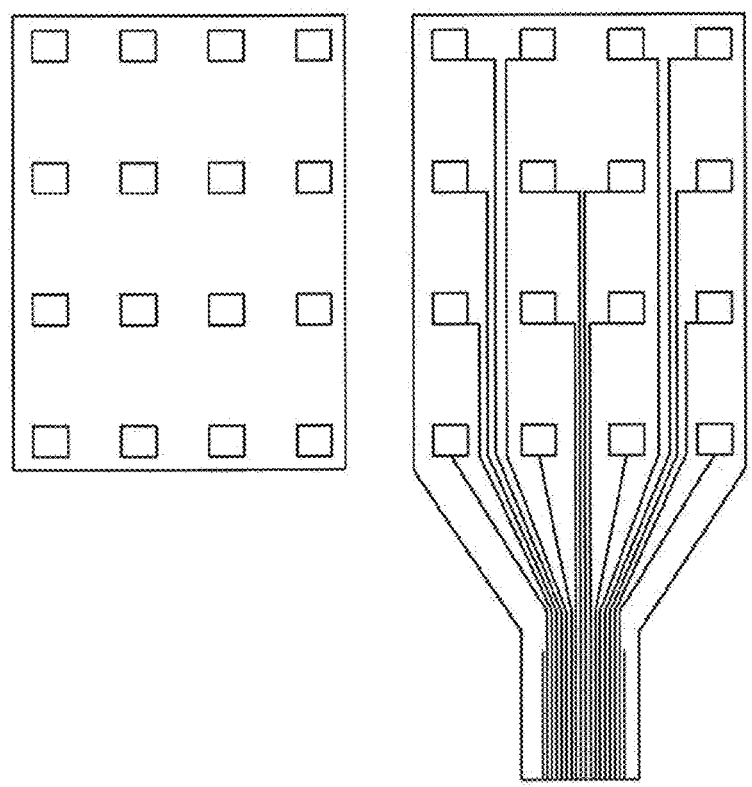
FIG. 12 is a drawing illustrating an example ceramic sample including a sixteen-element electrical contact array and a flex circuit.
Figure 13:
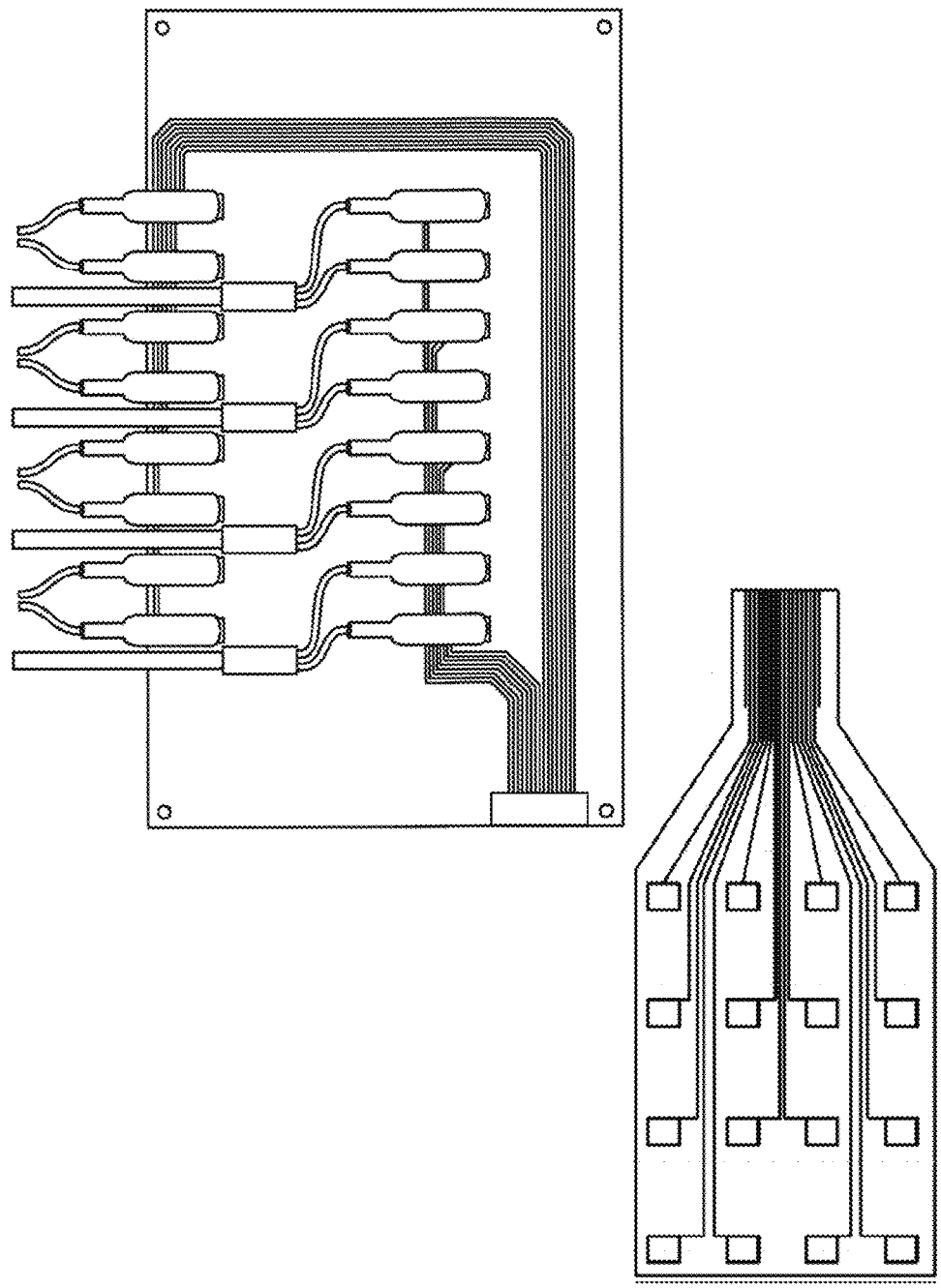
FIG. 13 is a drawing illustrating the example ceramic sample of FIG. 12 attached to a flex circuit, a breakout board, and a set of leads.

A ceramic sample included approximately 70% boron carbide and 30% silicon carbide. The back side of the ceramic sample was coated with a fiberglass/epoxy resin to keep the pieces in intimate contact after breaking. On the front side, sixteen approximately square electrical contacts were vapor deposited through a shadow mask. The electrical contacts included a first layer of titanium with a thickness of about 5 nanometers (nm) and a second layer of gold with a thickness of about 100 nm. A flex circuit was etched to match the locations of the electrical contacts, and a conductive silver-loaded epoxy was used to make electrical connections between the flex circuit and gold contacts. The flex circuit then was connected to a breakout board, which was connected to the switch matrixes. After the conductive epoxy was cured and the flex circuit attached to the electrical contacts, the ceramic sample was wrapped in tape to help further contain any pieces after breaking. FIG. 12 is a drawing illustrating the ceramic sample including the sixteen element electrical contact array and the flex circuit. FIG. 13 is a drawing illustrating an example ceramic material attached to a flex circuit, a breakout board, and a set of leads.

AC currents of 10 mA were applied to pairs of electrical contacts. Electrical contacts were numbered 1-16 and drive pairs were six electrical contacts apart (e.g. 1 and 7, 2 and 9, etc.) using modulo 16 math. Measurement pairs were adjacent (e.g. 1 and 2) again modulo 16. For each drive pair, all possible measurements were taken according to the following rule: the measurement pairs may not contain either drive electrical contact. Frequencies of 50 kHz, 100 kHz, and 150 kHz were used.

Figure 14:
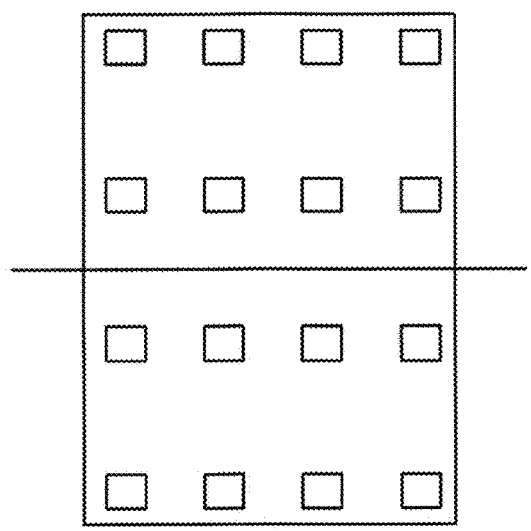
FIG. 14 is a drawing illustrating the example ceramic sample of FIG. 12 including an electrical contact array and a location of a crack.

A control dataset was taken prior to breaking the ceramic sample. After the initial dataset was taken, the sample was hit in approximately the center with a hammer, resulting in a crack located through the middle of the ceramic sample. FIG. 14 is a drawing illustrating the ceramic sample including an electrical contact array and the location of a crack. FIG. 14 illustrates the location of the crack as the horizontal line through the approximate center of the ceramic sample.

After breaking, a measurement data set was collected according to the rules described above. The control dataset and measurement data set were analyzed using electrical impedance tomography image reconstruction algorithms. In particular, the algorithm inv_solve_diff_GN_one_step in the package EIDORS was used to determine the approximate impedance change within the sample. MATLAB® is available from MathWorks®, Inc., Natick, Mass., United States. EIDORS is available at eidors3d.sourceforge.net. An L-Curve method of hyperparameter selection and a Laplace filter penalty function was utilized in the EIDORS package.

Figure 15:
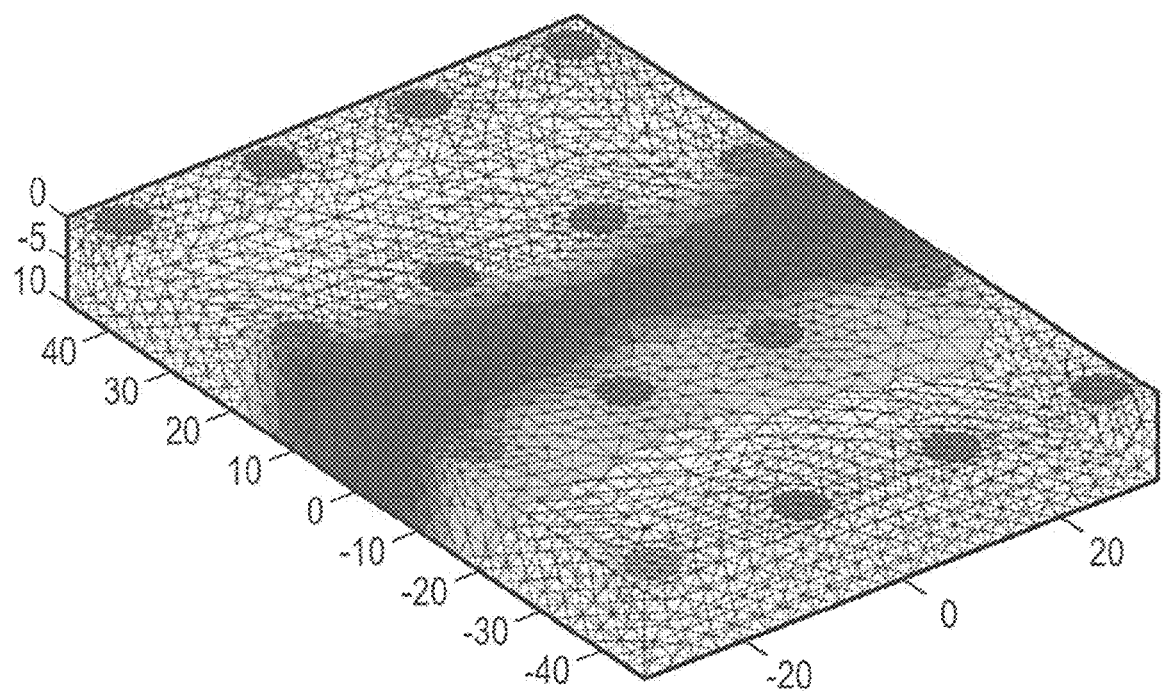
FIG. 15 is a diagram illustrating an example grayscale output of the EIDORS algorithm for the example ceramic sample of FIG. 14.

FIG. 15 is a diagram illustrating an example grayscale output of the EIDORS algorithm for the example ceramic sample of FIG. 14. The crack creates a region of higher resistance, and this is shown in the figure below as a drop in conductivity (darker shading indicates lower conductivity than the initial dataset).

Various examples have been described. These and other examples are within the scope of the following claims.

What is claimed is:

1. An article comprising:
    a material to be tested;
    a plurality of electrical contacts distributed about and electrically connected to the material to be tested; and
    a non-volatile memory (NVM) device attached to the material to be tested such that a major surface of the NVM device is perpendicular to a major surface of the material to be tested, wherein the NVM device is hardened against exposure to X-ray radiation, and wherein the NVM device is configured to provide at least one technique to reduce an effect of errors selected from the group consisting of data redundancy and error-correcting code.

2. The article of claim 1, wherein the NVM device comprises primary memory cells and redundant memory cells configured to store first and second copies of the same data, respectively.

3. The article of claim 1, wherein the NVM device is configured to perform the error correction code on data stored by the NVM device to recover error-laden data.

4. The article of claim 1, wherein the NVM device is configured to store data comprising control voltages associated with the material to be tested for use in a crack detection technique.

5. The article of claim 1, wherein the material to be tested comprises a ceramic.

6. The article of claim 5, wherein the ceramic comprises at least one of carbide (B4C), silicon carbide (SiC), alumina (Al2O3), or any composite thereof.

7. The article of claim 1, wherein the NVM device is electrically connected to an electrical connector, and wherein the electrical connector is attached to the tested material.

8. The article of claim 1, wherein the NVM device is electrically connected to a controller, wherein the controller is attached to the material to be tested, and wherein the controller is configured to:
for at least one pair of drive electrical contacts of a plurality of pairs of drive electrical contacts from the plurality of electrical contacts:
cause an electrical signal to be applied to the respective pair of drive electrical contacts;
for each respective measurement electrical contact of a plurality of measurement electrical contacts from the plurality of electrical contacts, cause a respective measured voltage to be determined using the respective measurement electrical contact;
retrieve a plurality of respective control voltages from the NVM device, each respective control voltage associated with a respective pair of drive electrical contacts and a respective measurement electrical contact; and
determine whether the material to be tested includes a defect based on the respective measured voltages and the respective control voltages.

9. The article of claim 8, wherein the defect is a crack.

10. The article of claim 8, wherein the controller is further configured to:
for at least one pair of drive electrical contacts of a plurality of pairs of drive electrical contacts from the plurality of electrical contacts:
cause an electrical signal to be applied to the respective pair of drive electrical contacts;
for each respective measurement electrical contact of a plurality of measurement electrical contacts from the plurality of electrical contacts, cause a respective measured voltage to be determined using the respective measurement electrical contact;
retrieve a plurality of respective control voltages from the NVM device, each respective control voltage associated with a respective pair of drive electrical contacts and a respective measurement electrical contact; and
determine whether the material to be tested includes a defect based on the respective measured voltages and the respective control voltages.

11. A measurement system comprising:
an article comprising:
a material to be tested;
a plurality of electrical contacts distributed about and electrically connected to the material to be tested;
a non-volatile memory (NVM) device attached to the material to be tested such that a major surface of the NVM device is perpendicular to a major surface of the material to be tested, wherein the NVM device is hardened against exposure to X-ray radiation, and wherein the NVM device is configured to store data comprising control voltages associated with the material to be tested and to provide at least one technique to reduce an effect of errors selected from the group consisting of data redundancy and error-correcting code; and
a controller configured to:
cause an electrical signal to be applied to a pair of drive electrical contacts from the plurality of electrical contacts;
cause a measured voltage to be determined using a measurement electrical contact from the plurality of electrical contacts;
retrieve a control voltage from the NVM device; and
determine whether the material to be tested includes a defect based on the measured voltage and the control voltage.

12. The measurement system of claim 11, wherein the defect is a crack.

13. The measurement system of claim 11, wherein the NVM device comprises primary memory cells and redundant memory cells configured to store first and second copies of the same data, respectively.

14. The measurement system of claim 11, wherein the NVM device is configured to perform the error correction code on data stored by the NVM device to recover error-laden data.

15. The measurement system of claim 11, wherein to determine whether the material to be tested includes the defect based on the measured voltage and the control voltage, the controller is configured to determine a ratio between the measured voltage and the control voltage.

16. A method comprising:
retrieving a plurality of control voltage values from a nonvolatile memory (NVM) device attached to an article comprising a material to be tested;
causing the material to be tested to be exposed to X-ray radiation; and
writing the plurality of control voltage values to the NVM device.

17. The method of claim 16, further comprising:
in response to causing the material to be tested to be exposed to X-ray radiation, determining whether the material to be tested includes a defect.

18. The method of claim 16, wherein the defect is a crack.

* * * * *